(12) United States Patent
Sakaguchi et al.

(10) Patent No.: US 8,860,116 B2
(45) Date of Patent: Oct. 14, 2014

(54) NONVOLATILE SEMICONDUCTOR MEMORY AND MANUFACTURING METHOD THEREOF

(75) Inventors: Takeshi Sakaguchi, Kawasaki (JP); Hiroyuki Nitta, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 755 days.

(21) Appl. No.: 12/546,885

(22) Filed: Aug. 25, 2009

(65) Prior Publication Data
US 2010/0052030 A1 Mar. 4, 2010

(30) Foreign Application Priority Data

Aug. 29, 2008 (JP) ................................. 2008-222292

(51) Int. Cl.
| | |
|---|---|
| H01L 29/76 | (2006.01) |
| H01L 27/115 | (2006.01) |
| H01L 21/3213 | (2006.01) |
| H01L 27/02 | (2006.01) |
| H01L 21/308 | (2006.01) |

(52) U.S. Cl.
CPC .... *H01L 27/11519* (2013.01); *H01L 27/11521* (2013.01); *H01L 21/32139* (2013.01); *H01L 27/11524* (2013.01); *H01L 27/0207* (2013.01); *H01L 21/3086* (2013.01)
USPC ........... 257/314; 257/315; 257/316; 257/319; 257/E27.103

(58) Field of Classification Search
CPC ............ H01L 27/105; H01L 27/11526; H01L 27/115; H01L 27/11543; H01L 27/11573; H01L 27/11546; H01L 27/11548; H01L 27/11568; H01L 29/42328; H01L 29/66825; H01L 29/788; H01L 29/7923
USPC ......... 257/314–326, 295, 298, E27.103, 29.3, 257/E21.68
See application file for complete search history.

(56) References Cited

U.S. PATENT DOCUMENTS

| | | | | |
|---|---|---|---|---|
| 5,659,500 | A | * | 8/1997 | Mehrad .................... 365/185.05 |
| 5,698,879 | A | * | 12/1997 | Aritome et al. ............... 257/315 |
| 6,063,688 | A | | 5/2000 | Doyle et al. |
| 6,310,374 | B1 | * | 10/2001 | Satoh et al. .................... 257/298 |
| 6,638,441 | B2 | | 10/2003 | Chang et al. |
| 6,787,860 | B1 | * | 9/2004 | Huang et al. .................. 257/390 |
| 7,291,560 | B2 | | 11/2007 | Parascandola et al. |
| 7,557,401 | B2 | | 7/2009 | Yonehama et al. |

(Continued)

FOREIGN PATENT DOCUMENTS

JP 2006-156657 6/2006

*Primary Examiner* — H Tsai
(74) *Attorney, Agent, or Firm* — Oblon, Spivak, McClelland, Maier & Neustadt, L.L.P.

(57) ABSTRACT

A nonvolatile semiconductor memory of an aspect of the present invention including a plurality of first active areas which are provided in the memory cell array side-by-side in a first direction and which have a dimension smaller than a fabrication limit dimension obtained by lithography, a second active area provided between the first active areas adjacent in the first direction, a memory cell unit which is provided in each of the plurality of first active areas and which has memory cells and select transistors, and a linear contact which is connected to one end of the memory cell unit and which extends in the first direction, wherein an area in which the linear contact is provided is one semiconductor area to which the plurality of first active areas are connected by the plurality of second active areas, and the bottom surface of the linear contact is planar.

6 Claims, 29 Drawing Sheets

(56) References Cited

U.S. PATENT DOCUMENTS

| | | | |
|---|---|---|---|
| 2002/0021582 A1* | 2/2002 | Rolandi | 365/185.2 |
| 2004/0084715 A1* | 5/2004 | Takeuchi et al. | 257/315 |
| 2005/0101081 A1* | 5/2005 | Goda et al. | 438/222 |
| 2008/0219054 A1 | 9/2008 | Arai et al. | |

* cited by examiner

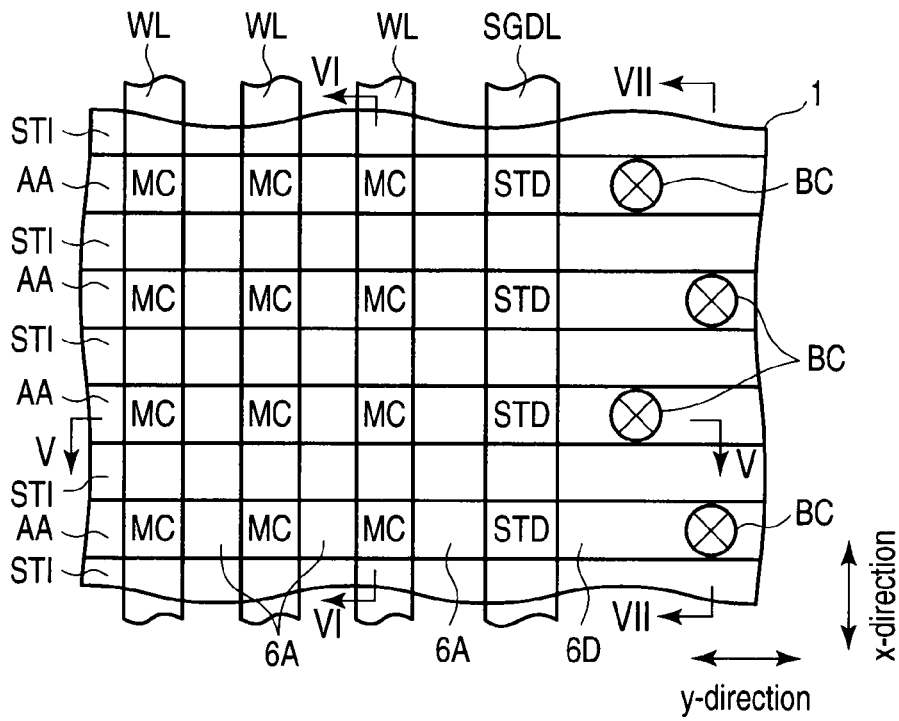
F I G. 4
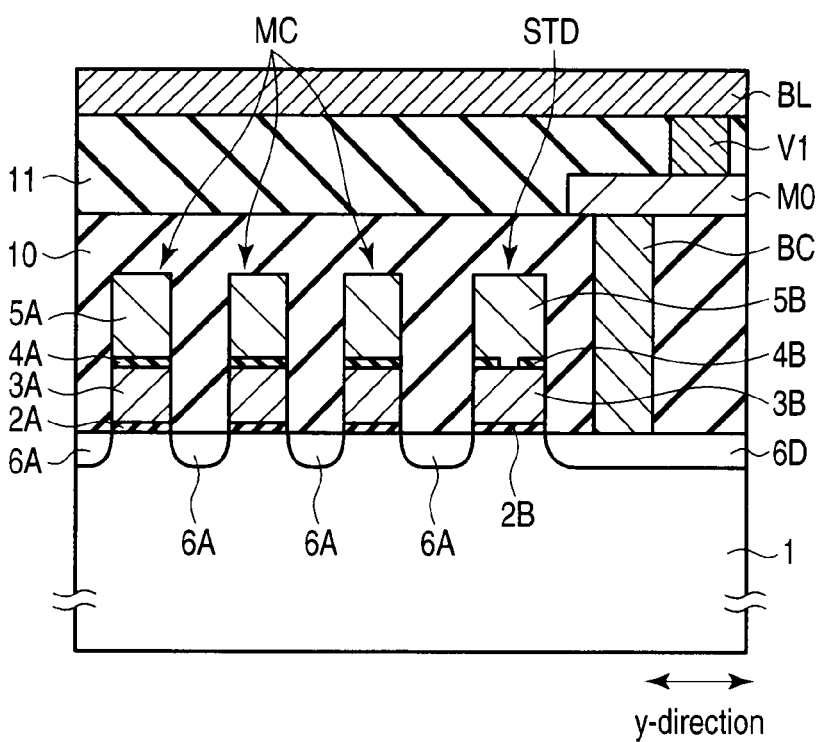
F I G. 5

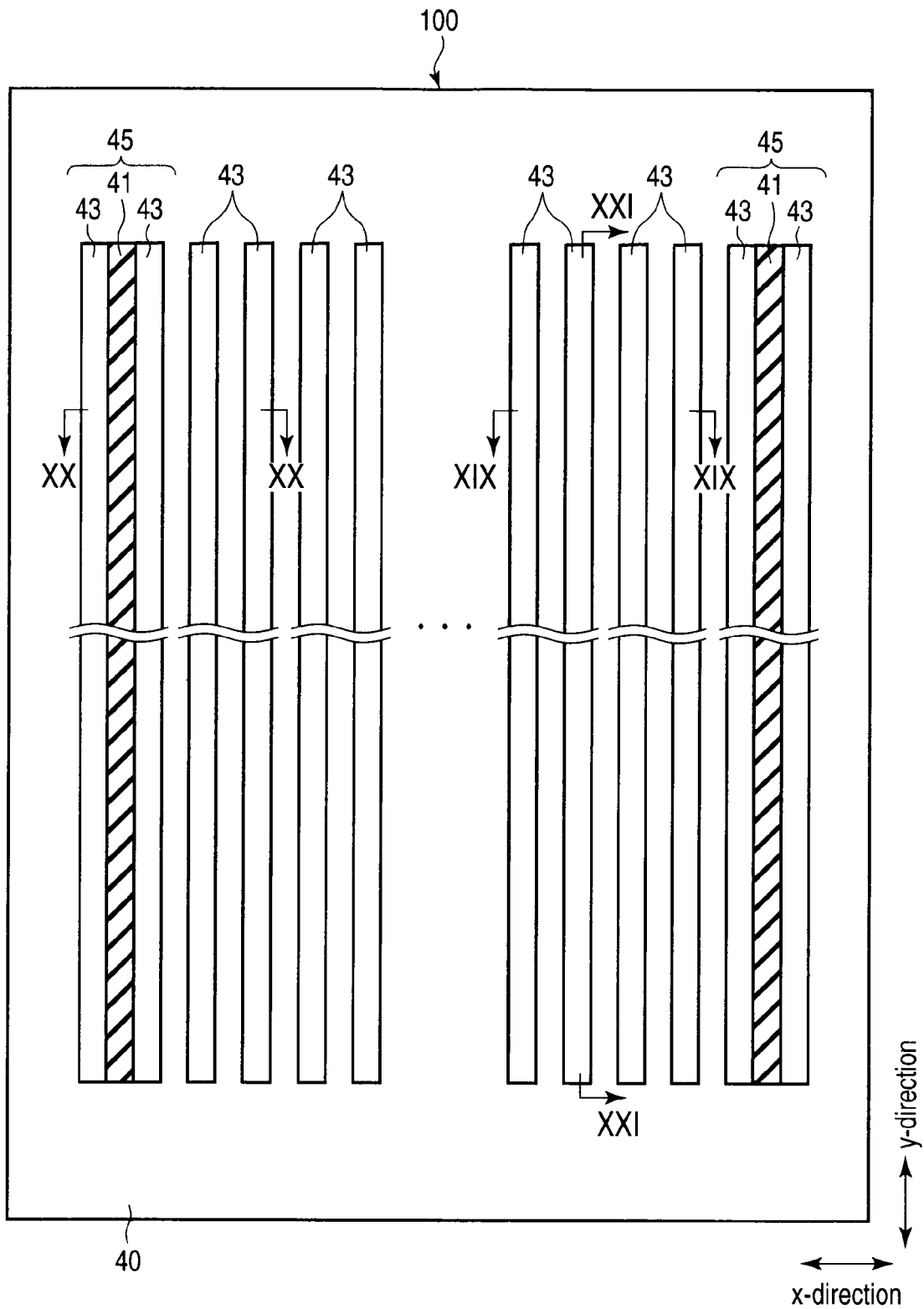
F I G. 18

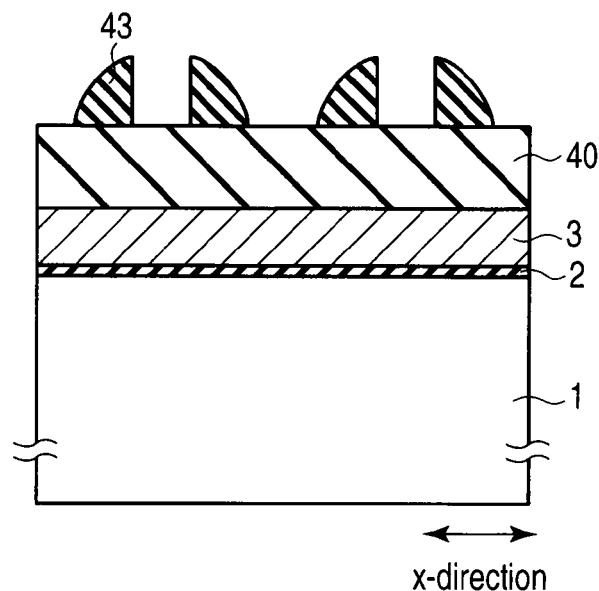
F I G. 1 9
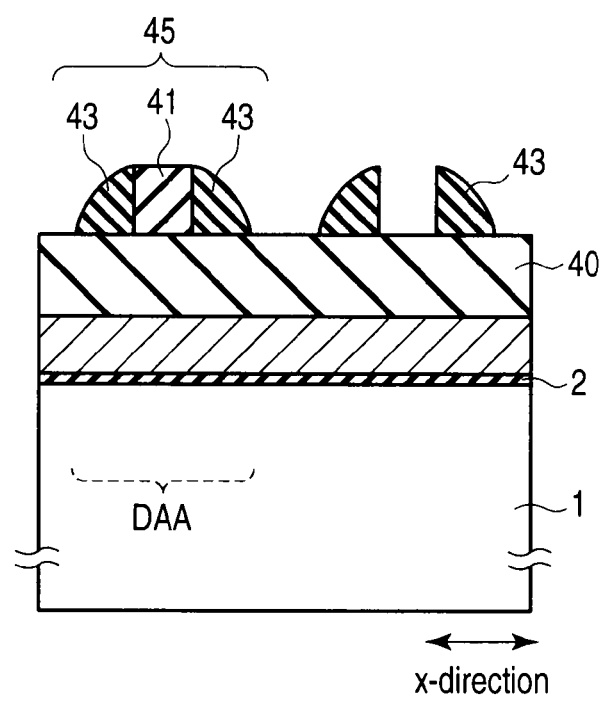
F I G. 2 0

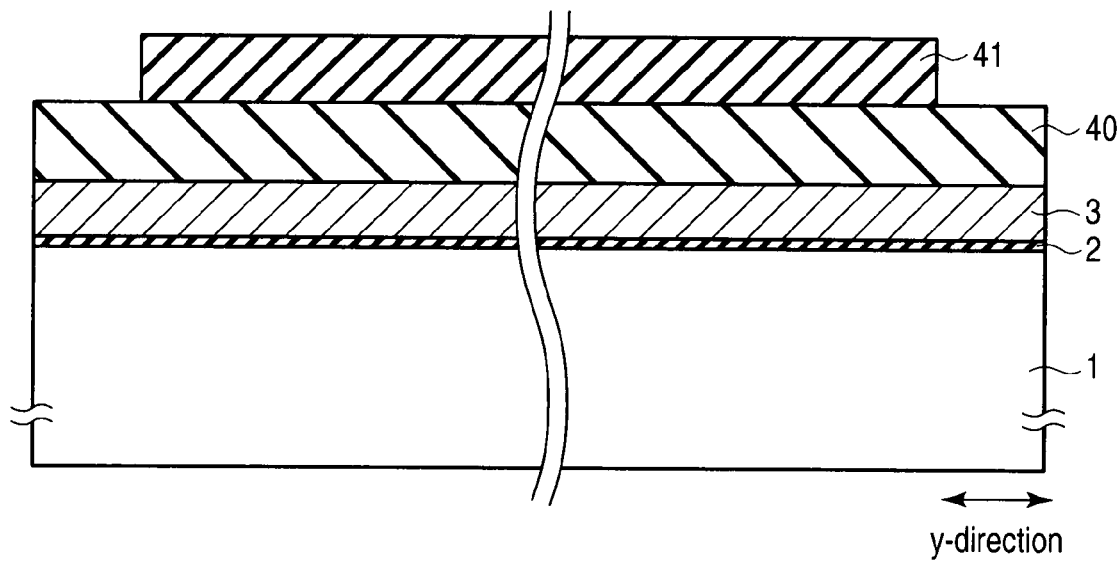
F I G. 21

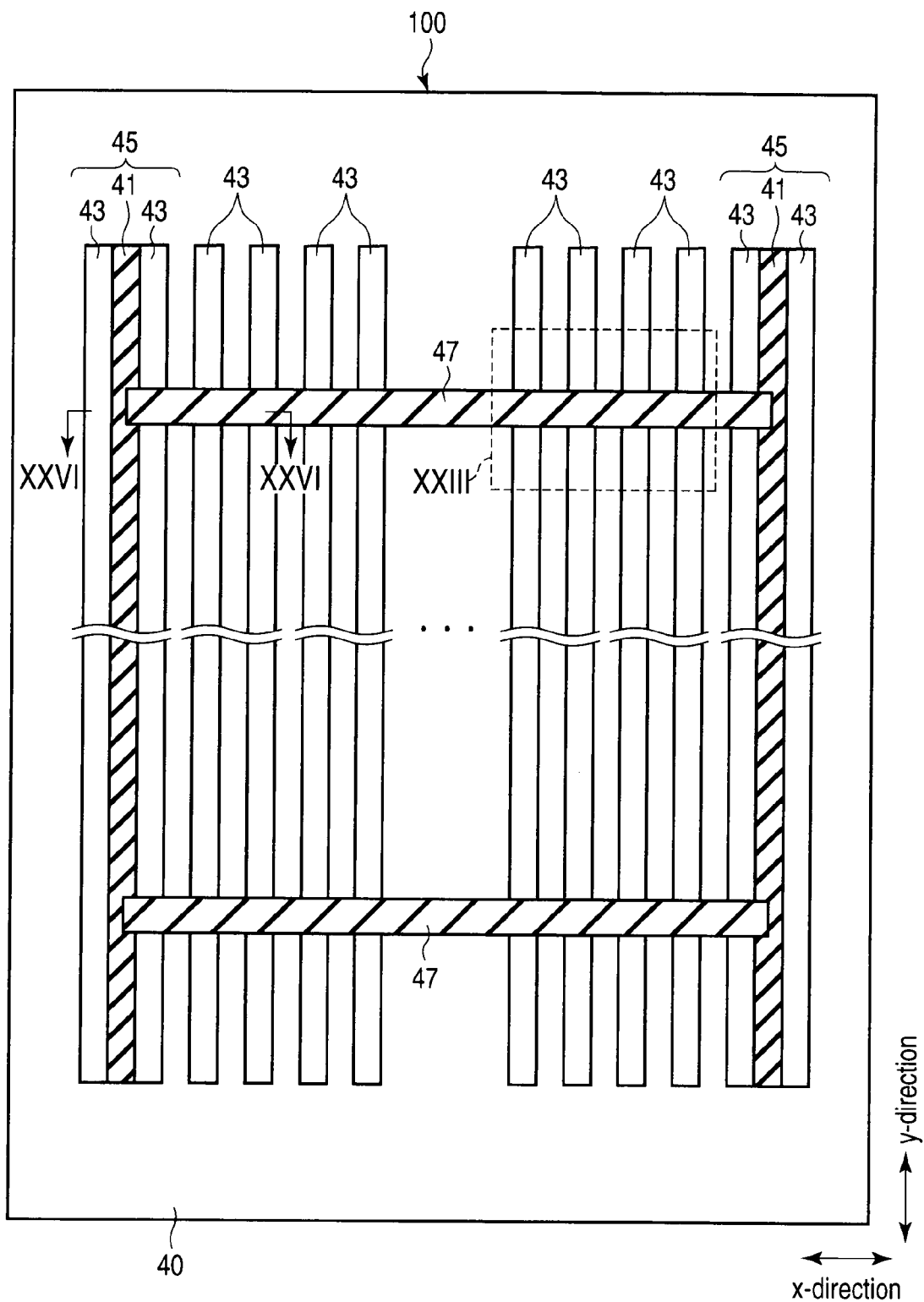
F I G. 22

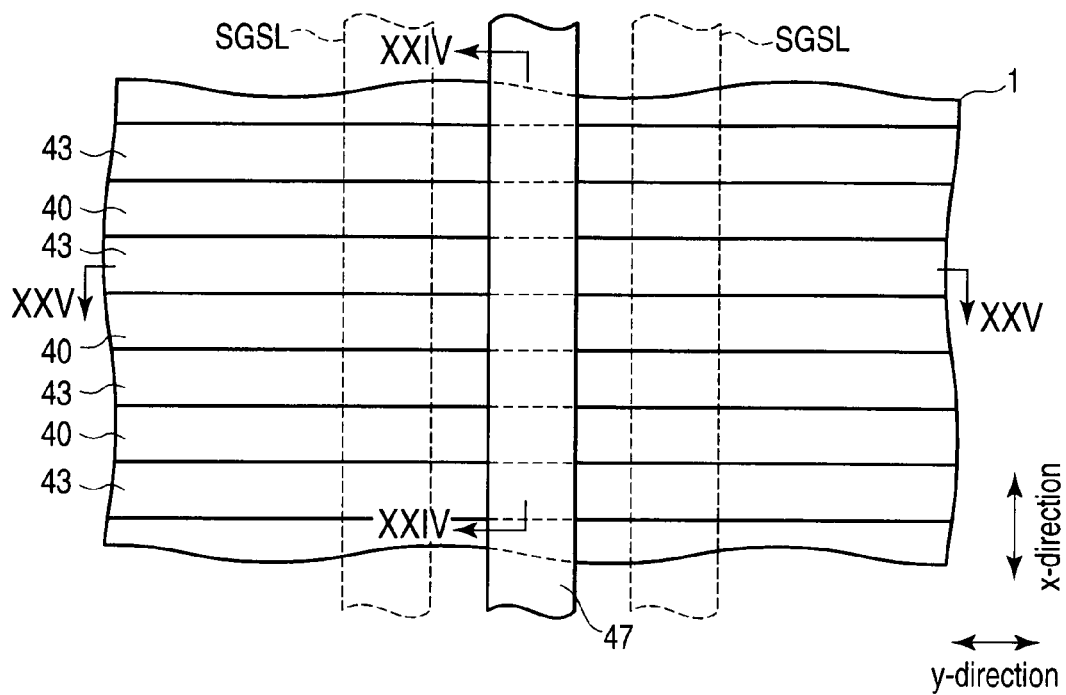
F I G. 2 3
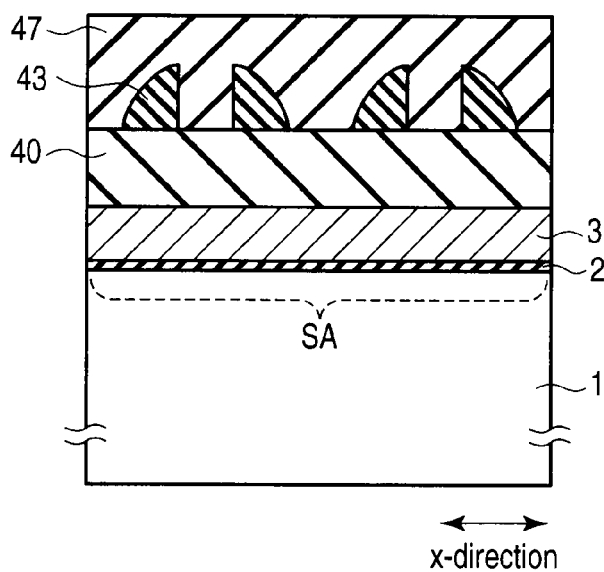
F I G. 2 4

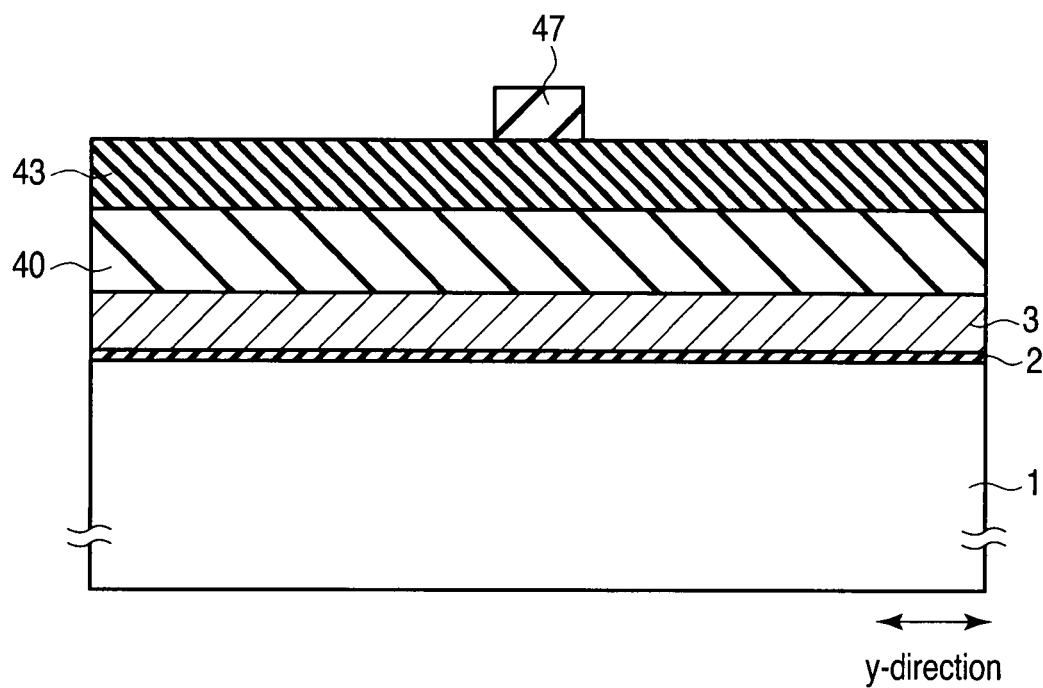
F I G. 2 5
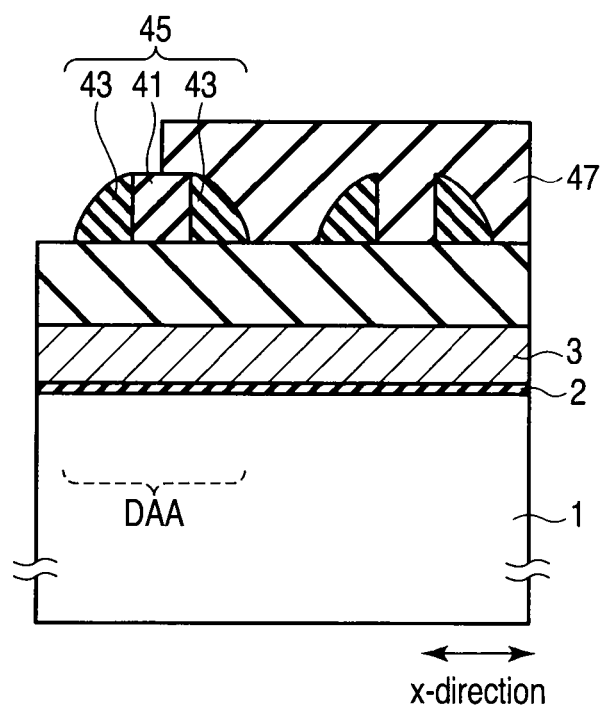
F I G. 2 6

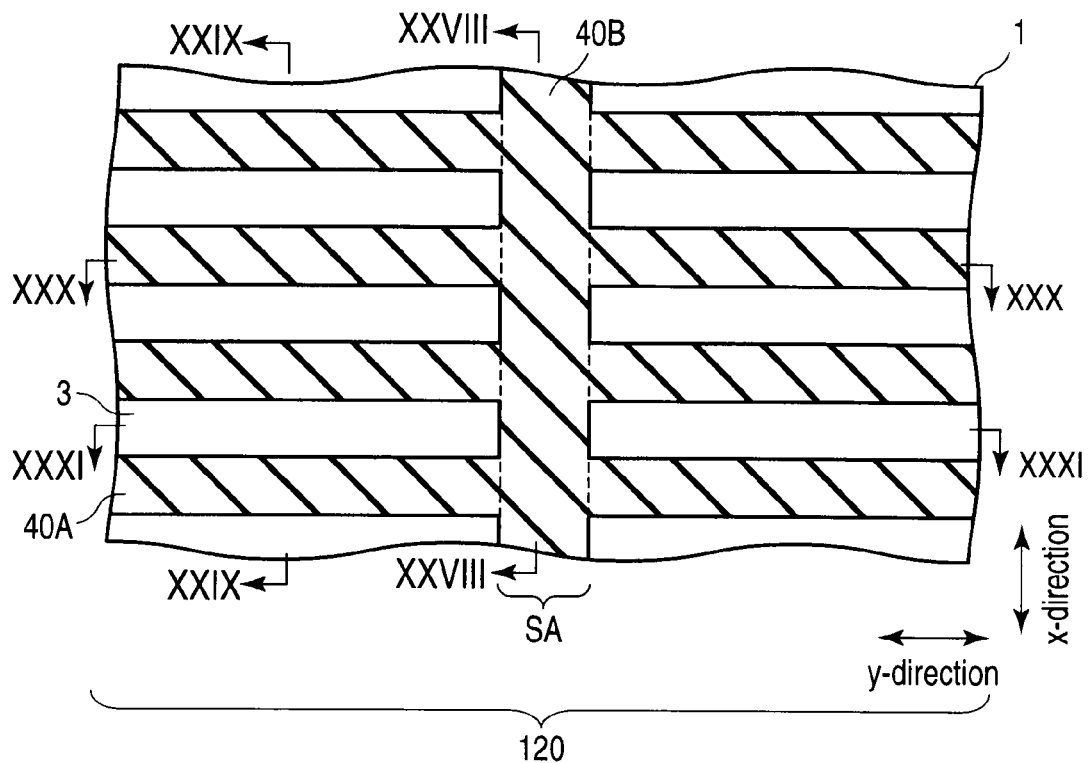
F I G. 27
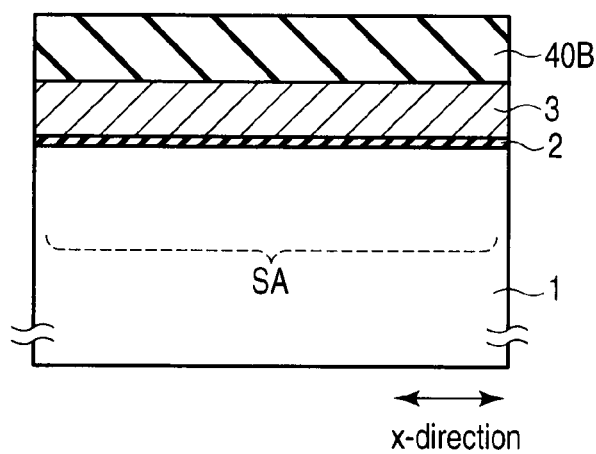
F I G. 28

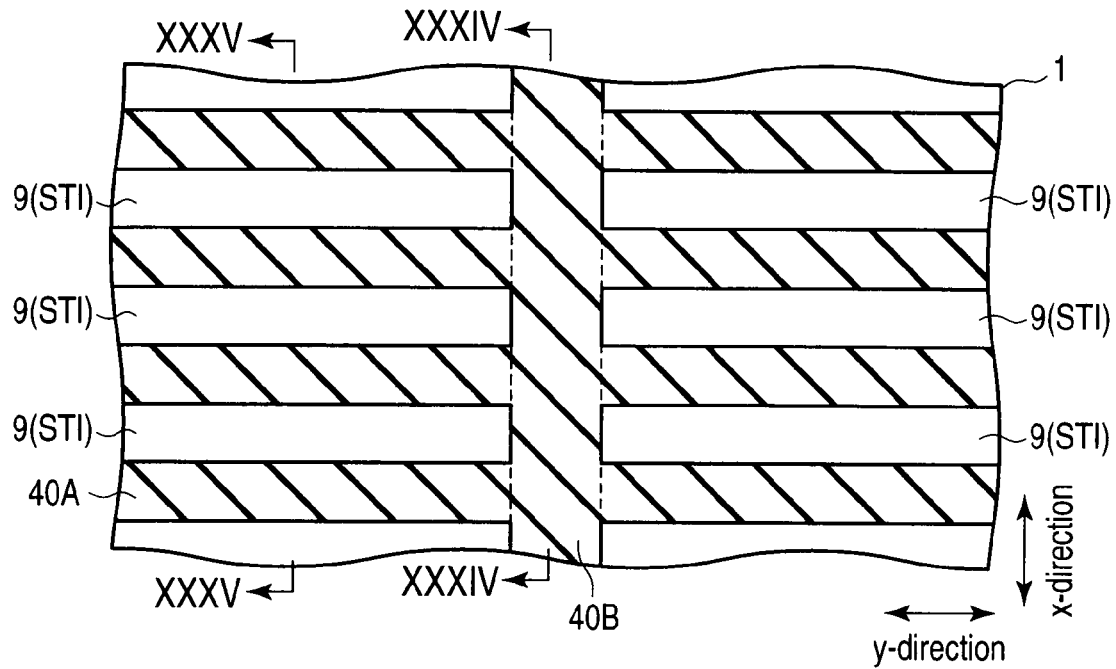
F I G. 3 3
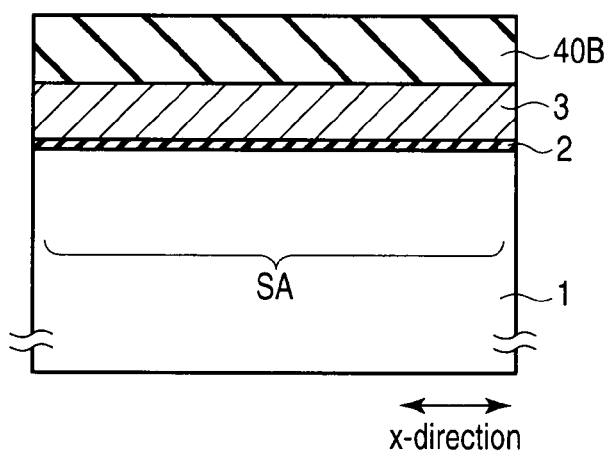
F I G. 3 4

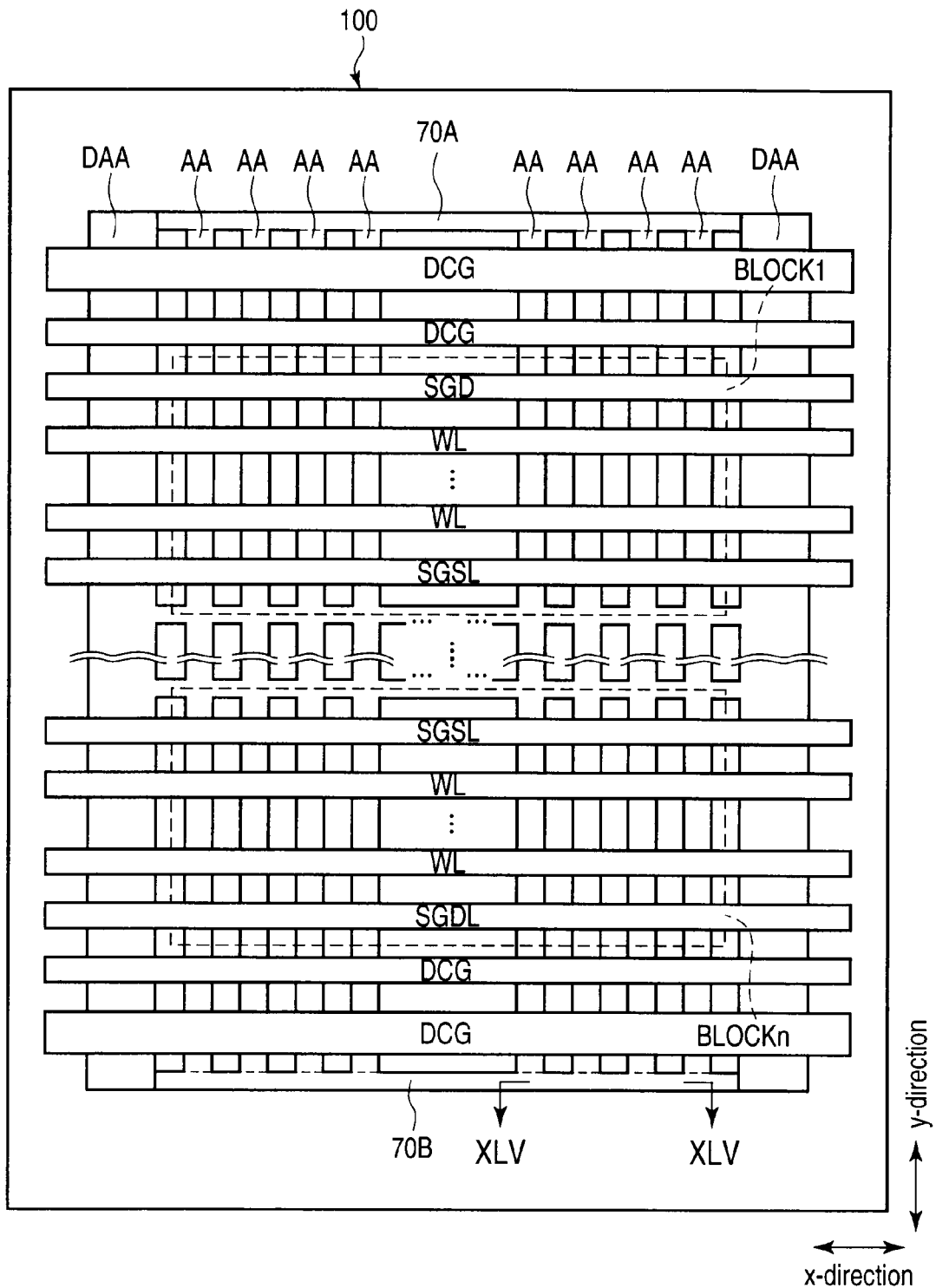
F I G. 44

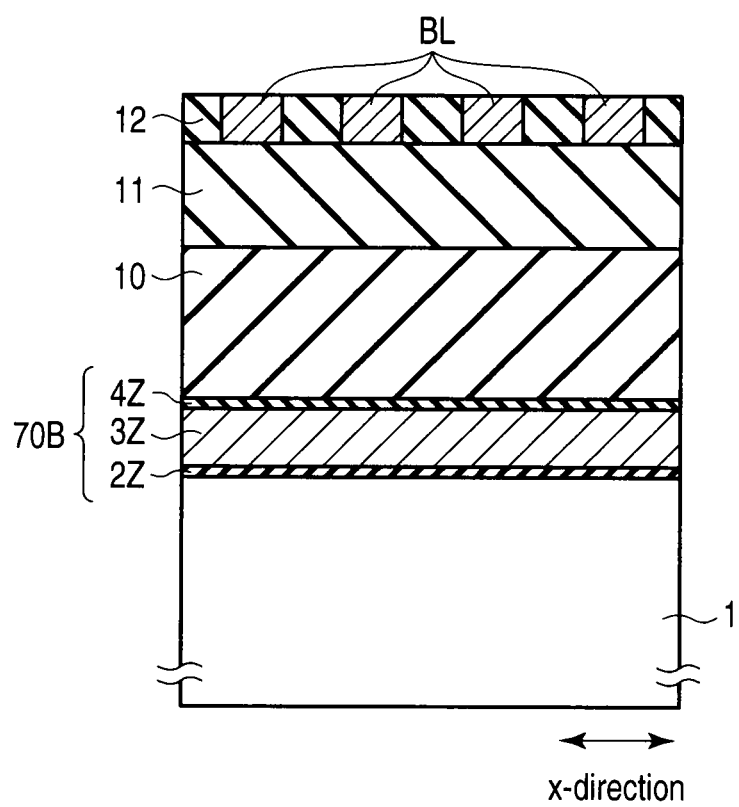
F I G. 4 5

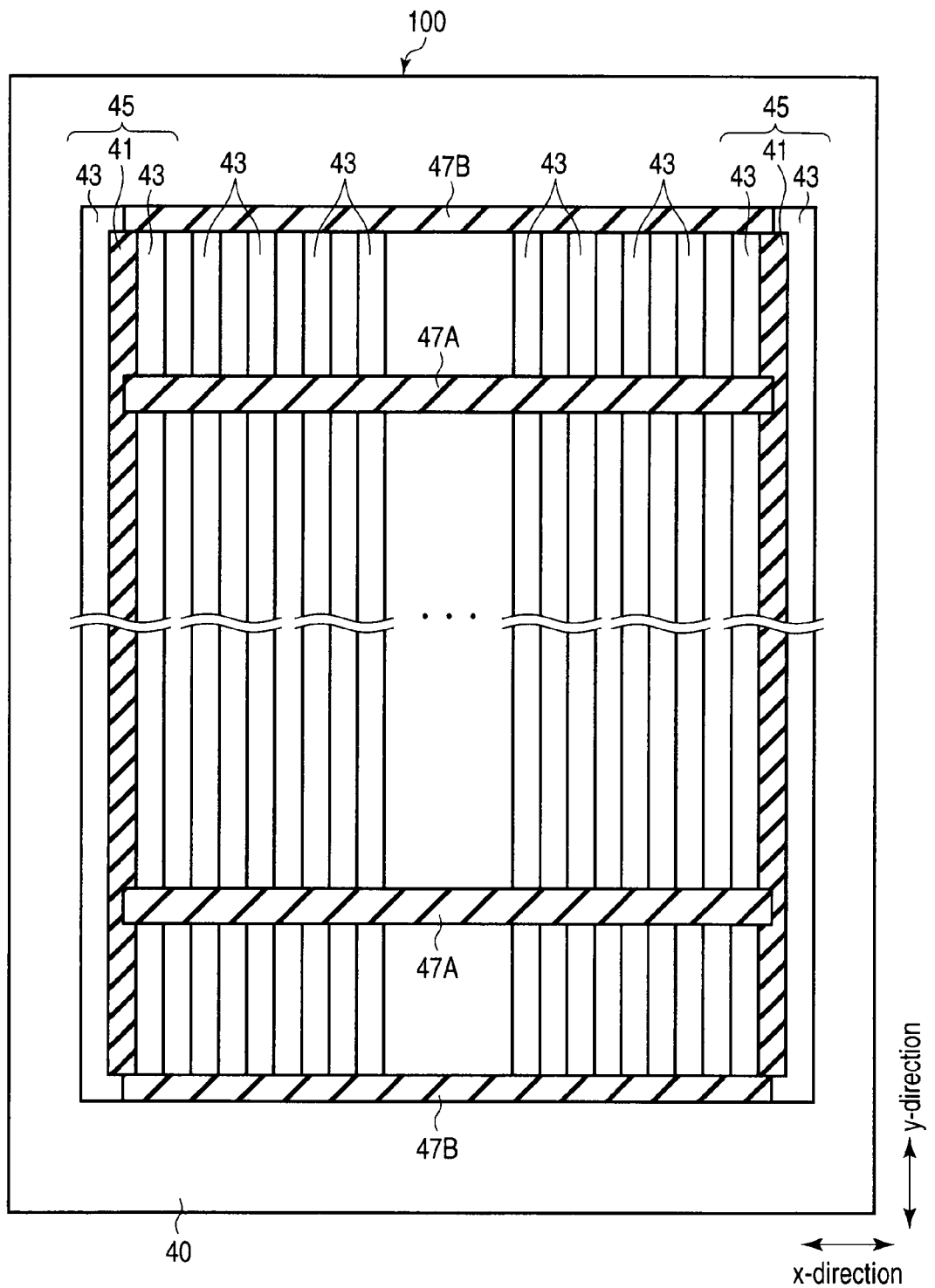
F I G. 46

NONVOLATILE SEMICONDUCTOR MEMORY AND MANUFACTURING METHOD THEREOF

CROSS-REFERENCE TO RELATED APPLICATIONS

This application is based upon and claims the benefit of priority from prior Japanese Patent Application No. 2008-222292, filed Aug. 29, 2008, the entire contents of which are incorporated herein by reference.

BACKGROUND OF THE INVENTION

1. Field of the Invention

The present invention relates to a nonvolatile semiconductor memory and a manufacturing method thereof, and more particularly, it relates to the structure of a flash memory and a manufacturing method thereof.

2. Description of the Related Art

Nonvolatile semiconductor memories such as flash memories are installed in various electronic devices as storage devices.

Flash memories are required to have increased storage capacities, and are being reduced in element size. Recently, there has been proposed, for example, a sidewall fabrication technique to obtain a dimension smaller than a fabrication limit dimension of lithography (exposure) (e.g., see Jpn. Pat. Appln. KOKAI Publication No. 2006-156657).

Storage capacity is also increased by elaborately designing the layout and structure of interconnect lines in the flash memory. One such example is the shape of a contact for connecting a memory cell or a memory cell unit including a plurality of memory cells to a source line. In the flash memory, taking its operation into account, the source line connected to the memory cell (memory cell unit) can be shared because the source line is collectively controlled by the plurality of memory cells arranged in the extending direction of the source line. Thus, a linear contact that can be shared by the plurality of memory cells is used in the flash memory. The use of such a linear (referred to as an LI structure) contact makes it possible to reduce the dimensions of the contact.

When the above-mentioned sidewall fabrication technique is used to form an active area in a memory cell array, the memory cell array has a structure in which the active areas and element isolation areas (isolation insulating films) are alternately arranged in the extending direction of the contact of the LI structure. In this case, the bottom of the contact of the LI structure is in contact with the active areas and the isolation insulating films.

When a linear trench is formed to embed the contact in an interlayer insulating film located on the active area and the isolation insulating film in order to form the contact of the LI structure, the upper surface of the active area and the upper surface of the isolation insulating film are subjected to an etching condition for the interlayer insulating film. Here, it is often the case that, with respect to the etching condition for the interlayer insulating film, a sufficient degree of etching selectivity cannot be ensured for the isolation insulating film in contrast with the active area. As a result, the isolation insulating film is etched, and the upper end of the isolation insulating film drops toward a semiconductor substrate further than the upper end of the active area.

Consequently, the surface of the semiconductor substrate in a contact area is unevenly structured, and the bottom of the contact of the LI structure is structured to be in contact with not only the upper surface of the active area but also the side surface of the active area.

Accordingly, the dielectric breakdown voltage of the isolation insulating film decreases, which causes deterioration of element characteristics such as an increased leakage current.

BRIEF SUMMARY OF THE INVENTION

A nonvolatile semiconductor memory of an aspect of the present invention comprising: a memory cell array provided in a semiconductor substrate; a plurality of first active areas which are provided in the memory cell array side-by-side in a first direction and which have a dimension smaller than a fabrication limit dimension obtained by lithography; a second active area provided between the first active areas adjacent in the first direction; a memory cell unit which is provided in each of the plurality of first active areas and which has memory cells and select transistors, a current path being connected in series to the memory cells and the select transistors along a second direction intersecting with the first direction; and a linear contact which is connected to one end of the memory cell unit and which extends in the first direction, wherein an area in which the linear contact is provided is one semiconductor area to which the plurality of first active areas are connected by the plurality of second active areas, and the bottom surface of the linear contact is planar.

A nonvolatile semiconductor memory of an aspect of the present invention comprising: a memory cell array provided in a semiconductor substrate; a plurality of first active areas which are provided in the memory cell array side-by-side in a first direction and which have a dimension smaller than a fabrication limit dimension obtained by lithography; a second active area provided between the first active areas adjacent in the first direction; a memory cell unit which is provided in each of the plurality of first active areas and which has memory cells and select transistors, a current path being connected in series to the memory cells and the select transistors along a second direction intersecting with the first direction; and a plurality of first contacts which are connected to one end of the memory cell unit and which are arranged in the first direction and which have columnar structures, wherein an area in which the first contacts are provided is one semiconductor area to which the plurality of first active areas are connected by the plurality of second active areas, the one first contact is shared by two or more memory cell units, and the bottom surfaces of the plurality of first contacts are planar.

A method of manufacturing a nonvolatile semiconductor memory A nonvolatile semiconductor memory of an aspect of the present invention comprising: forming a mask layer over a semiconductor substrate; forming a plurality of linear core materials which are arranged on the mask layer in a first direction and which extend in a second direction perpendicular to the first direction; reducing the line width of the plurality of core materials to be smaller than a fabrication limit dimension obtained by lithography and then forming a sidewall mask on the side surface of each of the core materials; forming a first resist mask on the mask layer and on the plurality of sidewall masks after removing the core materials, the first resist mask covering the upper part of a contact area and extending in the first direction; patterning the mask layer by use of the sidewall mask and the first resist mask; and forming a plurality of active areas and the contact area in the semiconductor substrate using the patterned mask layer as a mask, the plurality of active areas being arranged in the first direction and having a dimension smaller than a fabrication limit dimension obtained by lithography, the contact area being shared by the plurality of active areas and extending in the first direction.

BRIEF DESCRIPTION OF THE SEVERAL VIEWS OF THE DRAWING

FIG. 4 is a plan view showing the structure corresponding to a zone IV in FIG. 3;

FIG. 5 is a sectional view showing the structure along line V-V in FIG. 4;

FIG. 18 is a diagram schematically showing the planar structure in one step of the manufacturing process in the first embodiment;

FIG. 19 is a sectional view along line XIX-XIX in FIG. 18;

FIG. 20 is a sectional view along line XX-XX in FIG. 18;

FIG. 21 is a sectional view along line XXI-XXI in FIG. 18;

FIG. 22 is a diagram schematically showing the planar structure in one step of the manufacturing process in the first embodiment;

FIG. 23 is a plan view extracting a zone XXIII in FIG. 22;

FIG. 24 is a sectional view along line XXIV-XXIV in FIG. 23;

FIG. 25 is a sectional view along line XXV-XXV in FIG. 23;

FIG. 26 is a sectional view along line XXVI-XXVI in FIG. 22;

FIG. 27 is a diagram schematically showing the planar structure in one step of the manufacturing method in the first embodiment;

FIG. 28 is a sectional view along line XXVIII-XXVIII in FIG. 27;

FIG. 33 is a plan view for explaining one step of the manufacturing method in the first embodiment;

FIG. 34 is a sectional view along line XXXIV-XXXIV in FIG. 33;

FIG. 44 is a plan view showing the structure of a nonvolatile semiconductor memory according to a third embodiment;

FIG. 45 is a sectional view along line XLV-XLV in FIG. 44; and

FIG. 46 is a plan view for explaining one step of the manufacturing process of the nonvolatile semiconductor memory according to the third embodiment.

DETAILED DESCRIPTION OF THE INVENTION

Embodiments of the present invention will hereinafter be described in detail with reference to the drawings.

1. Outline

A nonvolatile semiconductor memory according to the embodiments of the present invention concerns, for example, a flash memory. In the flash memory according to the embodiments of the present invention, a plurality of active areas arranged in a first direction in a memory cell array are formed by the sidewall fabrication technique. Thus, the dimension of the active area in the first direction is smaller than a fabrication limit dimension (feature size) obtained by lithography.

A memory cell unit is provided in each of the plurality of active areas, and a source line contact is connected to one end (source side) of the memory cell unit. This source line contact is, for example, a linear (LI structure) contact extending in the first direction. No isolation insulating film is provided in an area (source line contact area) where the source line contact is provided, and the source line contact area extends in the first direction.

Thus, the present embodiment is characterized in that the source line contact area is one semiconductor area shared by the plurality of active areas arranged in the first direction, and that the bottom of the source line contact provided in this source line contact area is planar.

In the step of forming the active areas by a sidewall mask in a method of manufacturing the flash memory according to the embodiments of the present invention, the upper part of the source line contact area is covered with a resist mask so that a semiconductor substrate in this source line contact area may not be etched by a pattern of the sidewall mask. As a result, the source line contact area serves as one semiconductor area which is not divided by element isolation areas, and is shared by the plurality of active areas arranged in the first direction. As the source line contact is formed on the semiconductor substrate area which is not provided with this isolation insulating film, a source line contact formation area can retain planarity even if subjected to an etching condition for an interlayer insulating film. Thus, the source line contact of the LI structure to be formed later can be formed on the contact area having a planar surface, and the bottom surface of a contact will therefore be planar.

As described above, according to the embodiments of the present invention, deterioration of the element characteristics of the flash memory can be prevented.

2. Embodiments

First to third embodiments of the present invention will be described with FIGS. 1 to 44.

(1) First Embodiment (a) Structure

Figure 1:
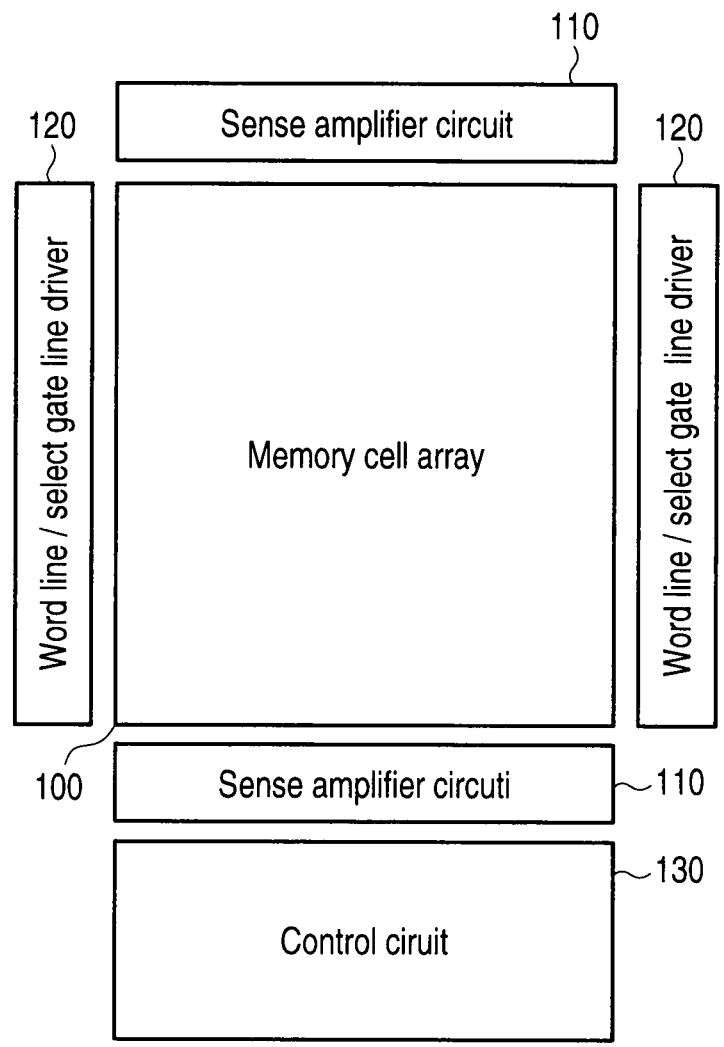
FIG. 1 is a diagram showing the overall configuration of a nonvolatile semiconductor memory according to an embodiment of the present invention.

The overall configuration of a nonvolatile semiconductor memory according to the embodiment of the present invention is described with FIG. 1. In the present embodiment, a flash memory is described as an example of the nonvolatile semiconductor memory.

FIG. 1 is a schematic diagram showing the configuration of the flash memory. As shown in FIG. 1, the flash memory includes a memory cell array 100, and peripheral circuits for controlling the operation of the memory cell array 100, including word line/select gate line drivers 120, sense amplifier circuits 110 and a control circuit 130.

Figure 2:
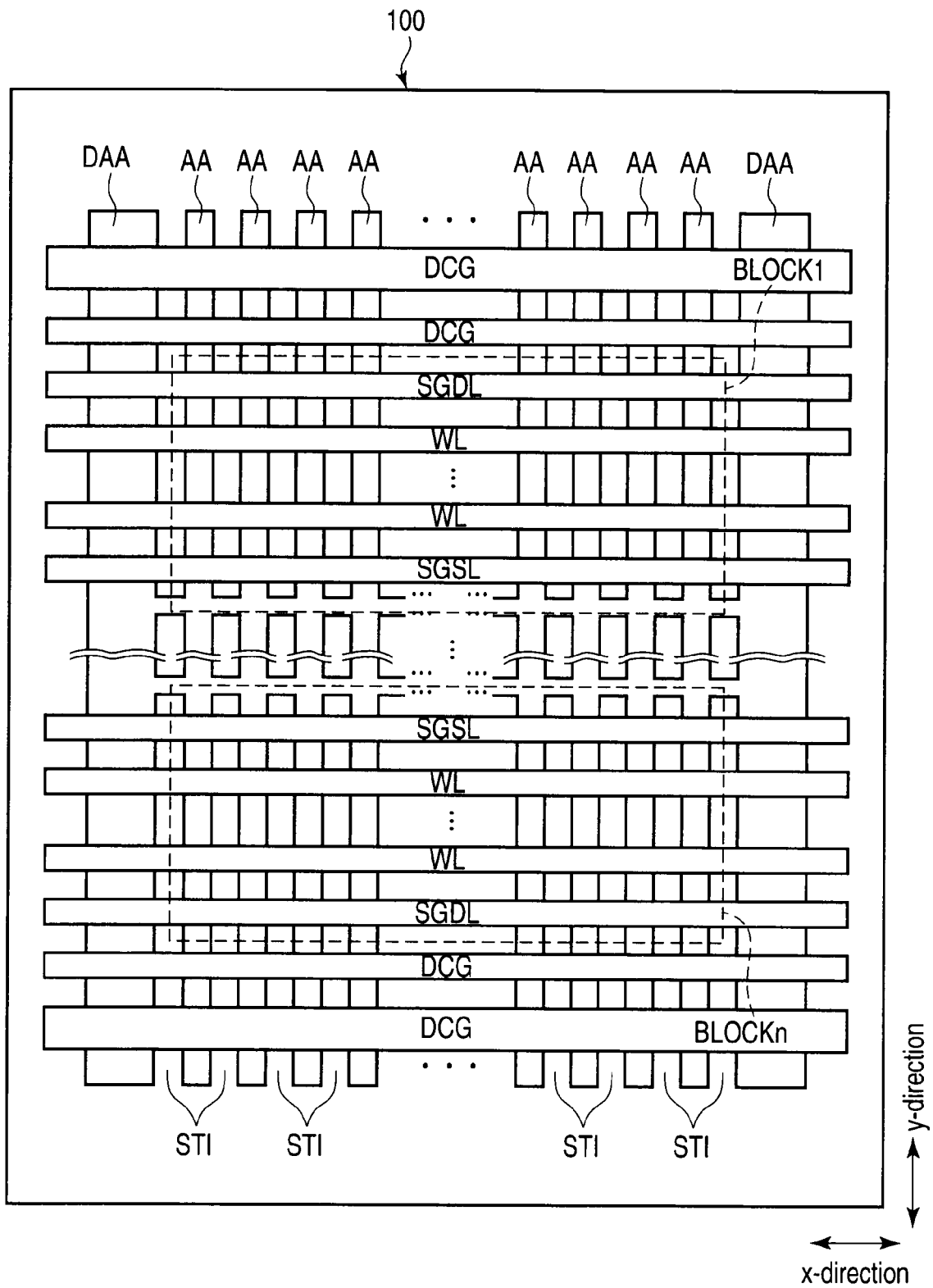
FIG. 2 is a plan view schematically showing the structure of a memory cell array.

FIG. 2 is a plan view showing one example of the structure of the memory cell array 100.

As shown in FIG. 2, the memory cell array 100 includes a plurality of active areas (first active areas) AA which extend in a y-direction (second direction) and which are arranged along an x-direction (first direction). An element isolation area STI is provided between two active areas AA adjacent in the x-direction. This element isolation area STI electrically isolates the active areas AA adjacent in the x-direction. The active areas AA are formed by, for example, the sidewall fabrication technique capable of forming a dimension smaller than a fabrication limit dimension (feature size) obtained by lithography. Thus, the dimension (line width) of the active area AA in the x-direction is minimum fabrication size W2, and smaller than a feature size F which is the fabrication limit dimension obtained by lithography.

In the memory cell array 100, dummy active areas DAA are provided adjacently to one end and the other of the plurality of active areas AA in the x-direction. The dimension of the dummy active area DAA in the x-direction is greater than or equal to the dimension of the active area AA in the x-direction, and is, for example, about 3×W2.

A plurality of word lines WL and select gate lines SGSL, SGDL extending in the x-direction are provided on the active areas AA. A plurality of bit lines (not shown) extending in the y-direction are provided over the active areas AA.

A memory cell unit (not shown) constituted of a plurality of memory cells and select transistors to which a current path is connected in series is provided in the active area AA. The memory cells and select transistors are arranged along the y-direction (second direction) in the active area AA extending in the y-direction. Each of the memory cells is provided at the position where the word line WL and the active area AA intersect with each other. Each of the select transistors is provided at the position where the select gate line SGDL, SGSL and the active area AA intersect with each other.

Furthermore, at the ends of the memory cell array 100 in the y-direction, dummy lines DCG are provided adjacently to the select gate lines SGDL, SGSL and the word lines WL arranged in the y-direction.

When the flash memory is, for example, a NAND type flash memory, the memory cell array 100 has a plurality of (in this example, n) blocks BLOCK1 to BLOCKn. The blocks BLOCK1 to BLOCKn are arranged in the y-direction. Each one of the blocks BLOCK1 to BLOCKn includes a plurality of memory cell units arranged in the x-direction. In the NAND type flash memory, the blocks BLOCK1 to BLOCKn mean the minimum unit of erasure, that is, the minimum number of memory cells for which erasure is permitted at a time.

Figure 3:
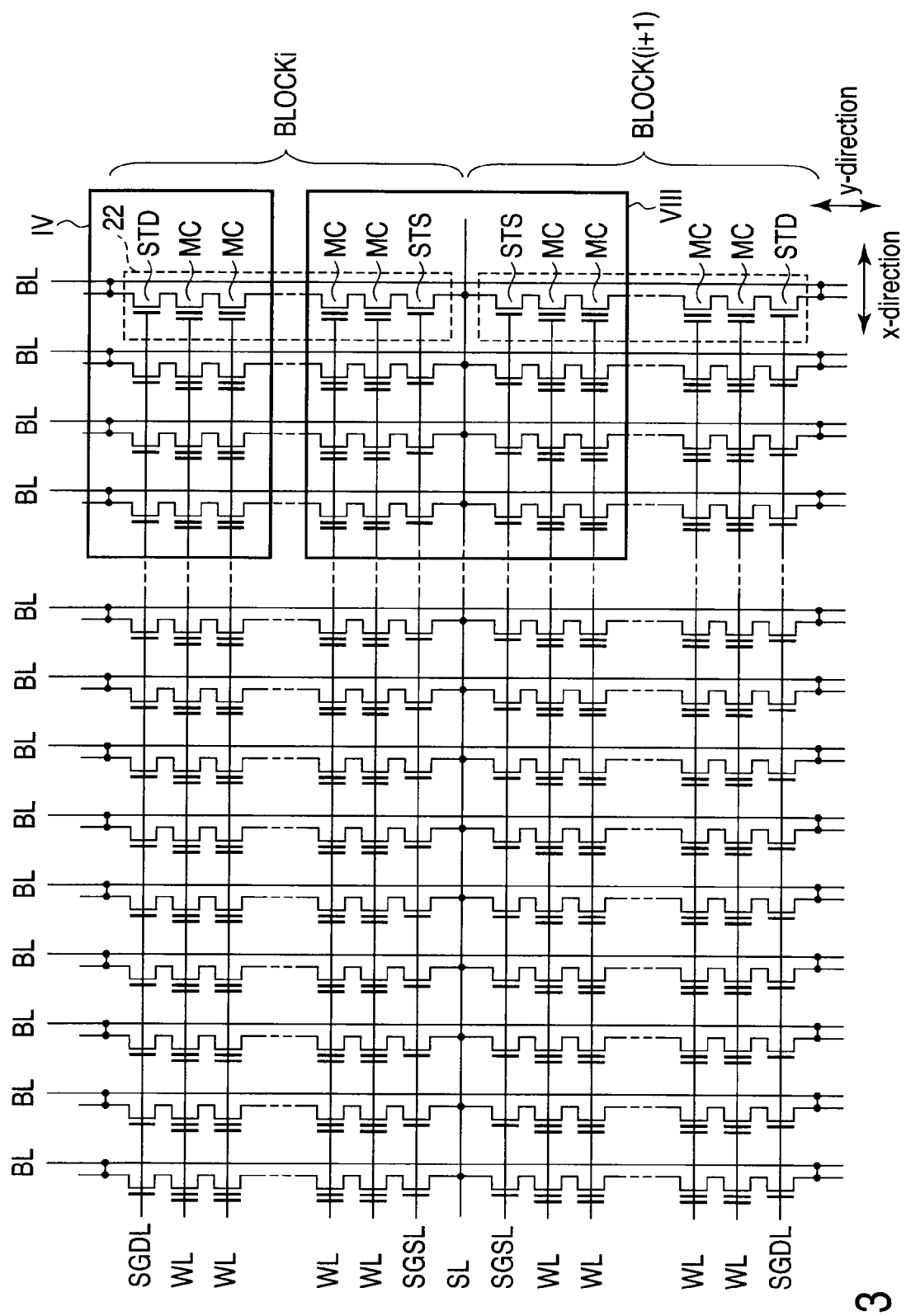
FIG. 3 is an equivalent circuit diagram showing the internal configuration of the memory cell array.

FIG. 3 shows equivalent circuits of adjacent two blocks BLOCKi, BLOCK(i+1) in the memory cell array 100.

As shown in FIG. 3, in the memory cell unit of the NAND type flash memory (hereinafter referred to as a NAND cell unit), a plurality of metal-insulator-semiconductor (MIS) transistors of a stack gate structure as memory cells MC are connected in series in such a manner as to share a source/drain. The word lines WL extending in the x-direction are connected to the gates of the memory cells MC.

Furthermore, select transistors STS, STD are connected in series to one end (source side) and the other (drain side) of the plurality of the memory cells MC connected in series (hereinafter referred to as a NAND string) in such a manner as to share the source/drain with the memory cells MC.

A drain-side select gate line SGDL extending in the x-direction is connected to the gate of the select transistor (hereinafter referred to as a drain-side select transistor) STD which is connected to the drain-side of a NAND string. A bit line BL extending in the y-direction is connected to the drain of the drain-side select transistor STD. The bit line BL is shared by two blocks BLOCKi, BLOCK(i+1) adjacent in the y-direction.

A source-side select gate line SGSL extending in the x-direction is connected to the gate of the select transistor (hereinafter referred to as a source-side select transistor) STS which is connected to the source side of the NAND string. A source line SL is connected to the source of the source-side select transistor STS. The source line SL is shared by two blocks BLOCKi, BLOCK(i+1) adjacent in the y-direction, and also shared by the plurality of memory cell units arranged in the x-direction.

A bit line contact (not shown) is used to electrically connect the bit line BL to the NAND cell unit, and the bit line contact is provided in a predetermined region within the active area AA shown in FIG. 2. Moreover, a source line contact is used to electrically connect the source line SL to the NAND cell unit, and the source line contact is provided in a predetermined region within the active area AA shown in FIG. 2. The structures of parts corresponding to zones IV, VIII enclosed by dashed lines in FIG. 3 are described below in detail with FIGS. 4 to 10.

Figure 6:
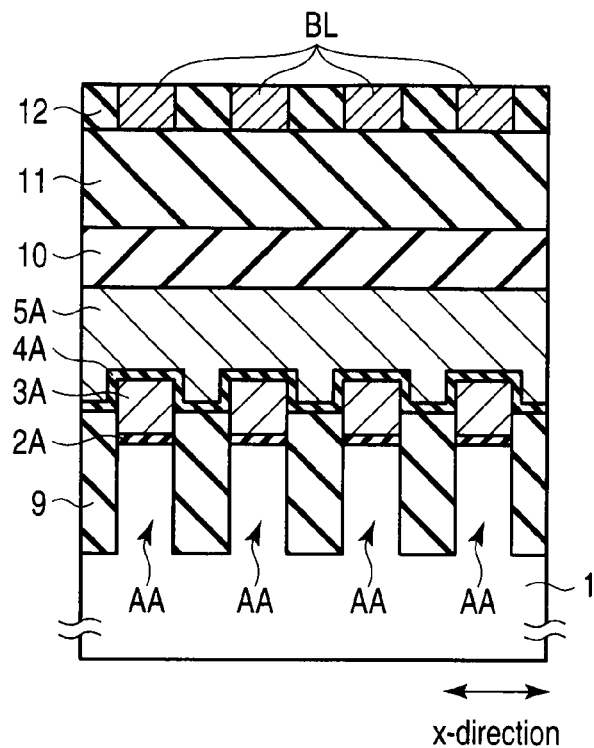
FIG. 6 is a sectional view showing the structure along line VI-VI in FIG. 4.
Figure 7:
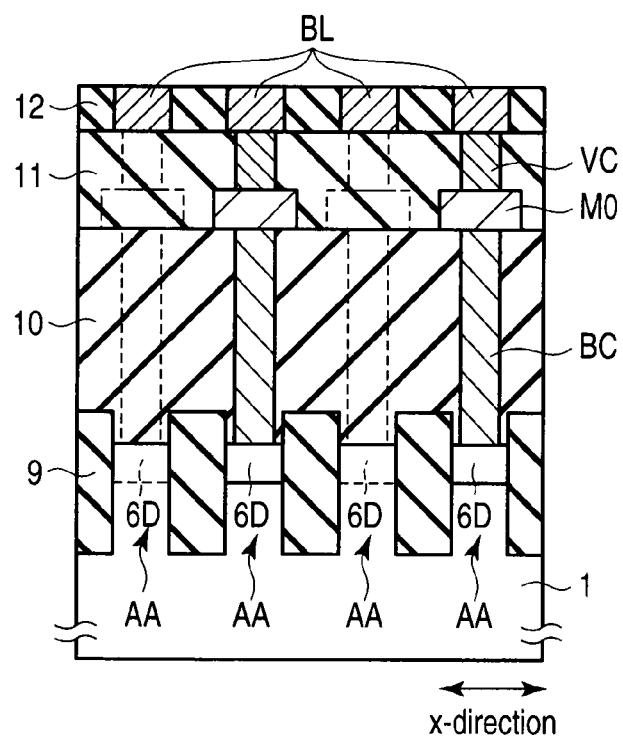
FIG. 7 is a sectional view showing the structure along line VII-VII in FIG. 4.

The planar structure and sectional structure of the part corresponding to zone IV shown in FIG. 3 are described with FIGS. 4 to 7. FIG. 4 shows the planar structure corresponding to zone IV in FIG. 3. FIG. 5 shows the sectional structure along line V-V in FIG. 4. FIG. 6 shows the sectional structure along line VI-VI in FIG. 4. FIG. 7 shows the sectional structure along line VII-VII in FIG. 4. The parts of the memory cell array shown in FIGS. 4 to 7 show one example of the configuration on the drain side of the NAND cell unit.

As shown in FIGS. 4 to 7, the surface of a semiconductor substrate 1 in the memory cell array is constituted of the active areas AA and the element isolation areas STI. The active area AA is formed by the sidewall fabrication technique, and the dimension (line width) of the active area AA in the x-direction is smaller than the fabrication limit dimension (feature size) obtained by lithography.

The memory cells MC and the drain-side select transistor STD are arranged in the active area AA. An isolation insulating film 9 is embedded in the element isolation area STI.

The memory cell MC is a MIS transistor having a stack gate structure as described above. That is, the memory cell MC has a structure in which a control gate electrode 5A is stacked on a floating gate electrode 3A.

The floating gate electrode 3A is provided on a gate insulating film (tunnel insulating film) 2A on the surface of the semiconductor substrate 1 (active area). The floating gate electrode 3A functions as a charge storage layer for retaining data (electrons). A polysilicon film, for example, is used as the floating gate electrode 3A.

The control gate electrode 5A is provided on the floating gate electrode 3A via an intergate insulating film 4A. The control gate electrode 5A functions as the word line WL, and is shared by the plurality of memory cells MC arranged in the x-direction. This control gate electrode 5A covers the upper surface and side surface of the floating gate electrode 3A. As a result, the coupling rate of the memory cells MC is improved. A silicide film containing one of nickel (Ni), cobalt (Co) and titanium (Ti), for example, is used as the control gate electrode 5A. However, the control gate electrode 5A may have a single-layer structure of a polysilicon film, or a polycide structure in which a silicide film is stacked on a polysilicon film.

Furthermore, an oxide-nitride-oxide (ONO) film or a high dielectric insulating film consisting of an oxide of hafnium (Hf) or aluminum (Al), for example, is used as the intergate insulating film 4A.

Although the floating gate electrode 3A is used as the charge storage layer in the memory cell in the example described in the embodiments of the present invention, the present invention is not limited to this. It goes without saying that the memory cell may have, for example, a metal-oxide-nitride-oxide-semiconductor (MONOS) structure in which an insulating film such as a silicon nitride film is used as the charge storage layer.

A plurality of diffusion layers 6A are provided in the semiconductor substrate 1. The diffusion layers 6A function as source/drain of the memory cells MC. The plurality of memory cells MC constituting one NAND string (NAND cell unit) share the source/drain diffusion layers 6A such that current paths are connected in series.

The drain-side select transistor STD provided on the drain side of the NAND string is formed simultaneously with the memory cells MC. Thus, the select transistor STD also has a stack gate structure similarly to the memory cells MC. However, in the select transistor STD, an intergate insulating film 4B has an opening through which a lower gate electrode 3B and an upper gate electrode 5A are directly connected to each other. In addition, the lower gate electrode 3B on a gate insulating film 2B is made of the same material as the floating gate electrode 3A, and the upper gate electrode 5A is made of the same material as a control gate electrode 5B. The gate electrodes 3B, 5B of the drain-side select transistor STD are shared by the plurality of drain-side select transistors STD arranged in the x-direction, and function as the drain-side select gate lines SGDL.

The drain-side select transistor STD shares one diffusion layer 6A of the source/drain diffusion layers 6A, 6D with the adjacent memory cell MC. Further, the bit line BL extending in the y-direction is connected to the other (drain side) source/drain diffusion layer 6D of the drain-side select transistor STD.

The bit line BL and the source/drain diffusion layer 6D are connected to each other through a bit line contact BC provided on the source/drain diffusion layer 6D and through a metal interconnect layer M0 and a via contact V1 provided in an interlayer insulating film 11. Thus, the bit line contact BC is located on the drain side of one NAND cell unit in the active area AA. The region of the active area AA where the bit line contact is located is hereinafter referred to as a bit line contact area. In addition, the bit line BL is provided in a trench formed in an interlayer insulating film 12.

In the NAND type flash memory, the transfer of data for one NAND cell unit is performed on a bit-line basis. Therefore, the bit line contact area in the active area AA is divided in the x-direction by the isolation insulating film 9 similarly to the NAND cell unit (memory cell MC). That is, the bit line contact BC is provided in each of the bit line contact areas (active areas AA) as an independent circularly (elliptically) or rectangularly columnar contact plug. However, the bit line contact BC is shared by two NAND cell units adjacent in the y-direction, so that one bit line contact BC is used for two NAND cell units.

Furthermore, when the active areas are formed by the sidewall fabrication technique as in the present embodiment, intervals of active areas in the x-direction are small. Therefore, in order to avoid a short circuit across the bit line contacts BC adjacent in the x-direction, the bit line contacts BC are arranged in the active areas AA as the bit line contact areas in accordance with a layout in which the locations of the contacts BC are alternately displaced in the y-direction.

Figure 8:
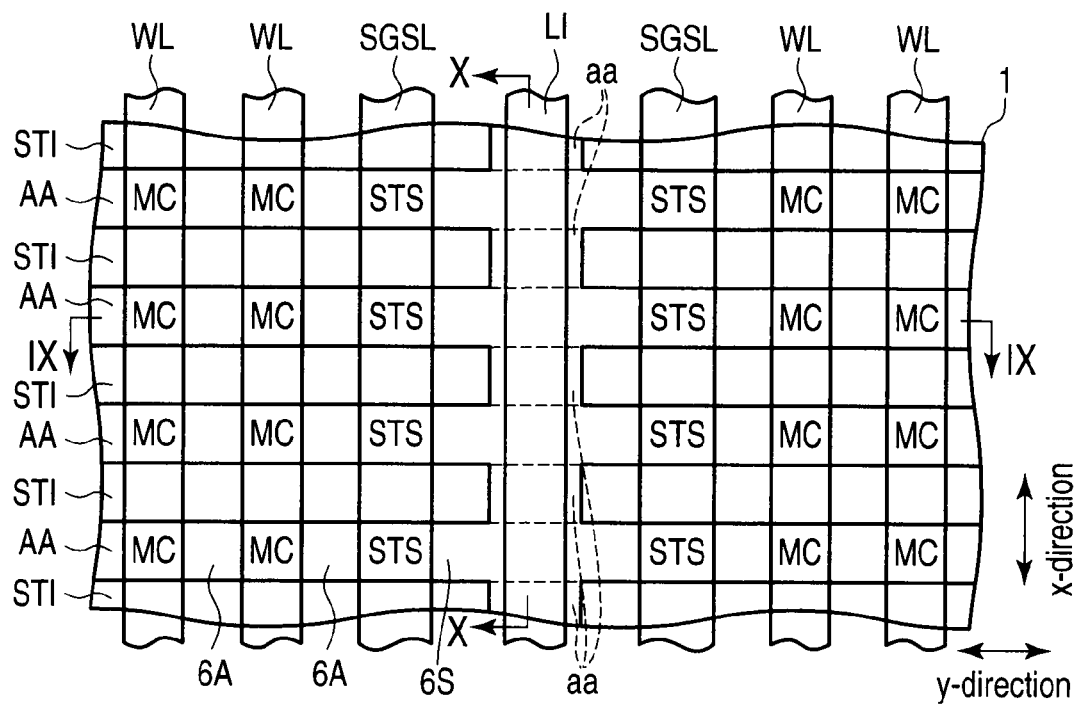
FIG. 8 is a plan view showing the structure corresponding to a zone VIII in FIG. 3.
Figure 9:
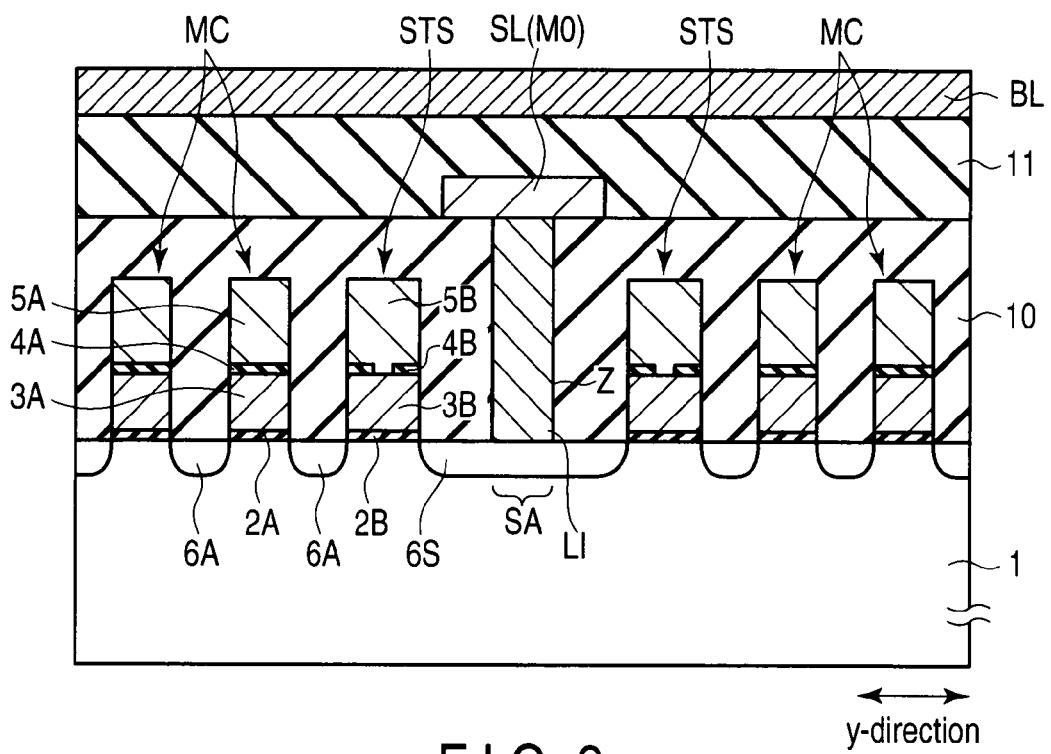
FIG. 9 is a sectional view showing the structure along line IX-IX in FIG. 8.
Figure 10:
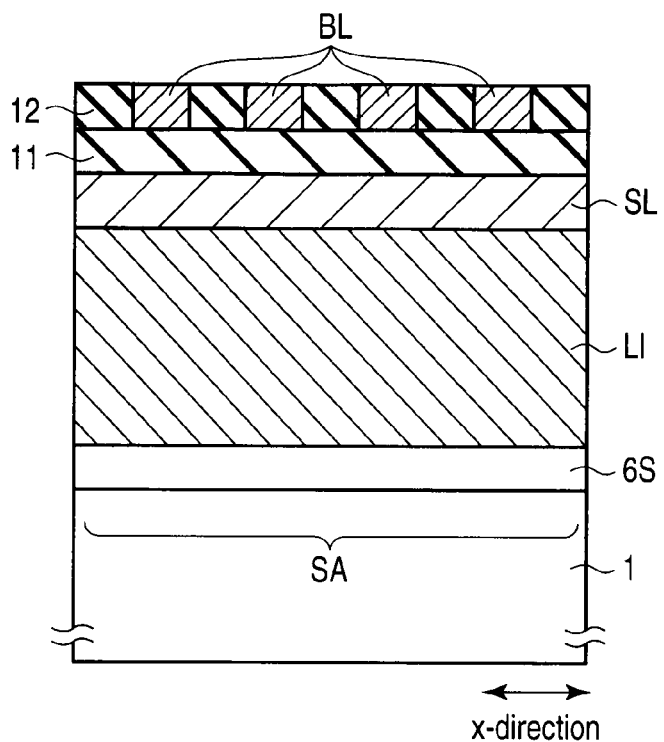
FIG. 10 is a sectional view showing the structure along line X-X in FIG. 8.

The planar structure and sectional structure of the part corresponding to zone VIII shown in FIG. 3 are described with FIGS. 8 to 10. FIG. 8 shows the planar structure corresponding to zone VIII in FIG. 3. FIG. 9 shows the sectional structure along line IX-IX in FIG. 8. FIG. 10 shows the sectional structure along line X-X in FIG. 8. The parts of the memory cell array shown in FIGS. 8 to 10 show the configuration on the source side of the NAND cell unit. It is to be noted that the same components as the components shown in FIGS. 4 to 7 are provided with the same signs and are described when needed.

The source-side select transistor STS provided on the source side of the NAND string is provided in the active area AA adjacently to the source side of the NAND string.

The source-side select transistor STS is formed simultaneously with the memory cells MC similarly to the drain-side select transistor STD. Therefore, the gate electrodes 3B, 5B of the select transistor STS are configured so that the lower gate electrode 3B and the upper electrode 5A are directly connected to each other through the opening of the intergate insulating film 4B. The gate electrodes 3B, 5B of the source-side select transistor STS is shared by the plurality of source-side select transistors STS arranged in the x-direction, and function as the source side select gate lines SGSL.

The source-side select transistor STS shares one diffusion layer 6A of the source/drain diffusion layers 6A, 6S with the memory cell MC. Further, a source line contact LI is provided on the other (source side) source/drain diffusion layer 6S of the source-side select transistor STS. The source line contact LI is embedded in a trench Z of an interlayer insulating film 10. Via this contact LI, one end of the memory cell unit is connected to the source line SL extending in the x-direction.

The source line contact LI has a linear structure called an LI structure extending in the x-direction.

The dimension of the source line contact LI in the y-direction is, for example, greater than or equal to the feature size. However, the dimension of the source line contact LI in the y-direction may be smaller than the feature size.

Hereinafter, the area in the source/drain diffusion layer 6S where the source line contact is located is also referred to as a source line contact area SA.

The source line contact areas SA (the source/drain diffusion layers 6S of the source-side select transistors STS) in the active areas AA serve as one semiconductor area (diffusion layer area) extending in the x-direction owing to areas (second active areas) aa which connect the plurality of active areas AA adjacent in the x-direction. Moreover, the source/drain diffusion layer 6S and the source line contact LI of the LI structure are shared by the plurality of active areas AA (memory cell units) adjacent in the x-direction. The dimension of the source line contact area SA in the y-direction is, for example, greater than or equal to the feature size. However, the dimension of the source line contact area SA in the y-direction may be smaller than the feature size.

In addition, the second active area aa, in FIG. 8, means a semiconductor area aa located between the element isolation areas STI adjacent in the y-direction in the source line contact area SA.

Thus, the source line contact area SA is one continuous area which is not divided by the isolation insulating film 9, so that the source line contact LI is formed on the source/drain diffusion layer 6S having a planar surface. Therefore, the bottom surface of the source line contact LI is planar.

In addition, the source/drain diffusion layer 6S and a source line contact LI of the LI structure are shared by adjacent two blocks BLOCKi, BLOCK(i+1).

Thus, unlike the bit line contact area and the bit line contact BC, the source line contact area SA and the source line contact LI can be shared by the plurality of active areas AA (NAND cell units) arranged in the x-direction because the source line SL is collectively controlled for one block BLOCKi.

Figure 11:
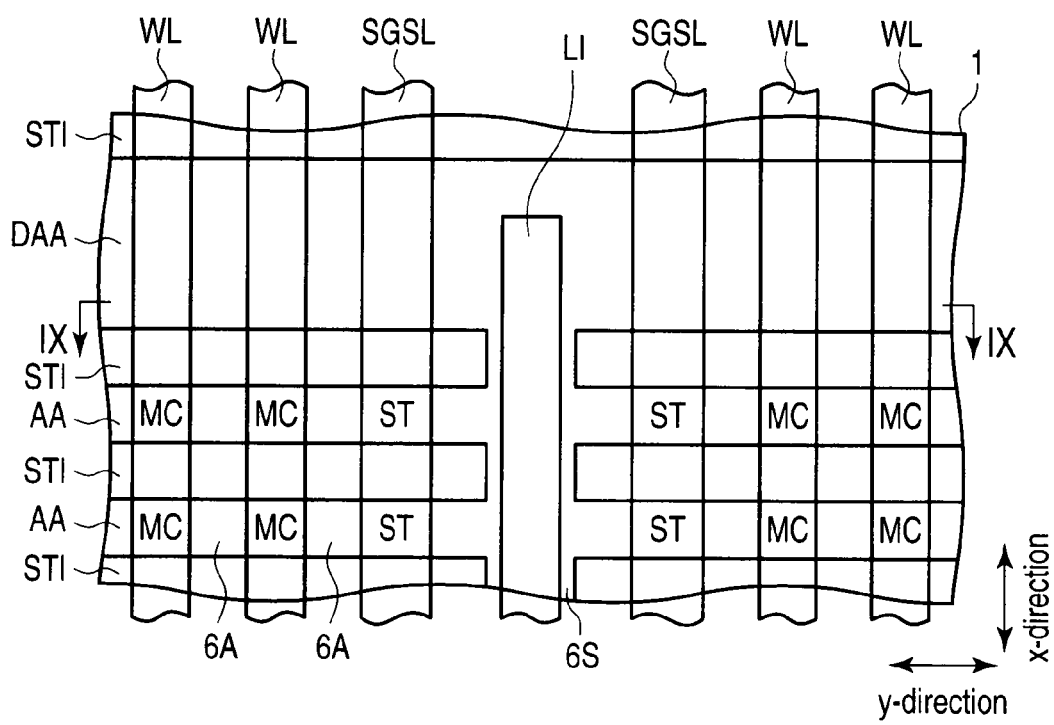
FIG. 11 is a plan view showing the structure of the end of the memory cell array.

Moreover, FIG. 11 shows the planar structure of the terminal end of the memory cell array in the y-direction. As shown in FIG. 11, the terminal end of the source line contact LI in the x-direction is provided in the dummy active area DAA. While the dimension of the dummy active area DAA in the x-direction is greater than the dimension of the active area AA in the x-direction, the structure of the dummy active area DAA in the y-direction is about the same as the structure of the active area AA in the y-direction. That is, elements of the same structure as the memory cells MC are formed in the dummy active area DAA, but these elements are dummy elements and do not function as storage elements.

The nonvolatile semiconductor memory according to the first embodiment of the present invention is a flash memory in which the memory cell unit is provided in the active area AA which has a dimension (width) smaller than the fabrication limit dimension (feature size) obtained by lithography. In this flash memory, the linear (LI structure) source line contact LI extending in the x-direction is connected to the memory cell unit.

Furthermore, the flash memory in the first embodiment of the present invention is characterized in that the area SA in which the linear source line contact LI is located is one semiconductor area to which the plurality of first active areas AA provided side-by-side in the x-direction are connected by the plurality of second active areas aa provided in this area SA. This flash memory is also characterized in that the bottom of the source line contact LI of the LI structure has a planar structure.

Thus, the source line contact area SA in the present embodiment is not divided by the element isolation areas (isolation insulating films). That is, the source line contact area SA is one continuous semiconductor area (diffusion layer), and has no isolation insulating film 9 provided therein.

Therefore, in the present embodiment, when the interlayer insulating film 10 is etched in the step of forming the source line contact LI, the isolation insulating film is not etched and thinned even if the surface of the source line contact area SA is subjected to an etching condition for the interlayer insulating film. Moreover, the upper end of the isolation insulating film 9 is not set back toward the semiconductor substrate further than the upper end of the active area AA due to the etching, and the side surface of the active area AA is thus not exposed.

As a result, in the present embodiment, the surface of the source line contact area SA is planar, and the source line contact LI of the LI structure extending in the x-direction can be provided on the source line contact area SA having a planar surface. That is, the bottom surface of the source line contact LI is planar, and the bottom of the source line contact LI of the LI structure does not contact the side surface of the active area AA.

Furthermore, as no isolation insulating film 9 is provided in the source line contact area SA, the source line contact LI of the LI structure extending in the x-direction does not intersect with the isolation insulating film 9.

Thus, in the flash memory of the present embodiment, there is neither decrease in the breakdown voltage of the isolation insulating film nor generation of a leakage current.

Moreover, the terminal end of the source line contact LI in the x-direction is provided in the dummy active area DAA, so that misalignment of the source line contact LI in the x-direction can be avoided. The reason is that the dimension of the dummy active area DAA in the x-direction is greater than the dimension of the active area AA in the x-direction.

Consequently, according to the nonvolatile semiconductor memory in the first embodiment of the present invention, deterioration of element characteristics can be prevented.

(b) Manufacturing Method

A process of manufacturing the nonvolatile semiconductor memory (flash memory) according to the first embodiment of the present invention is described with reference to FIGS. 4 to 40.

Figure 12:
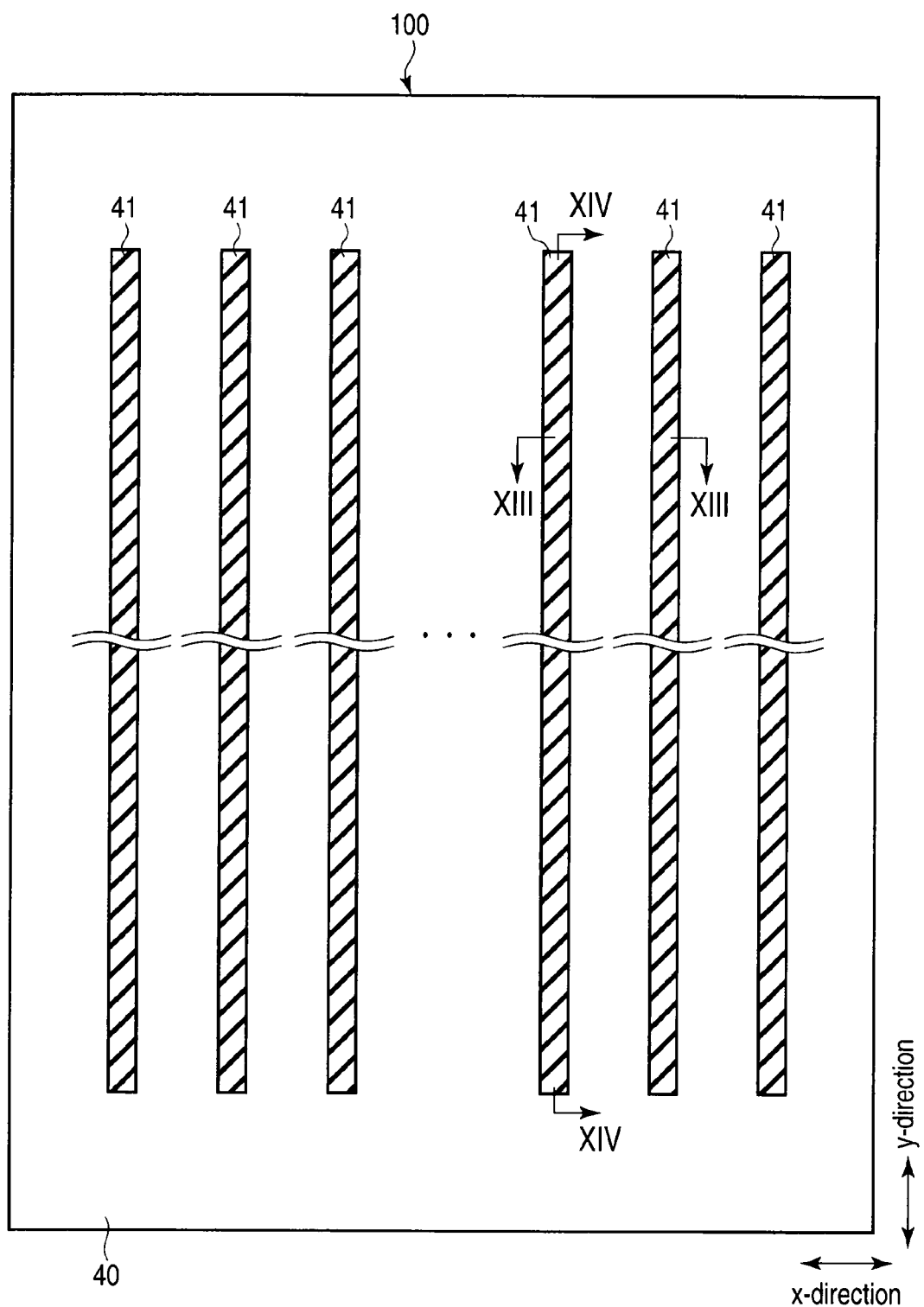
FIG. 12 is a plan view schematically showing one step of a manufacturing process in a first embodiment.
Figure 13:
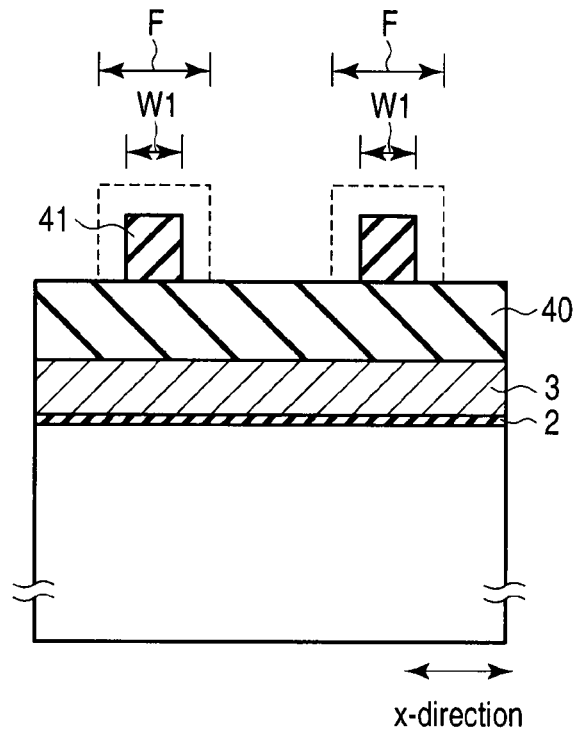
FIG. 13 is a sectional view along line XIII-XIII in FIG. 12.
Figure 14:
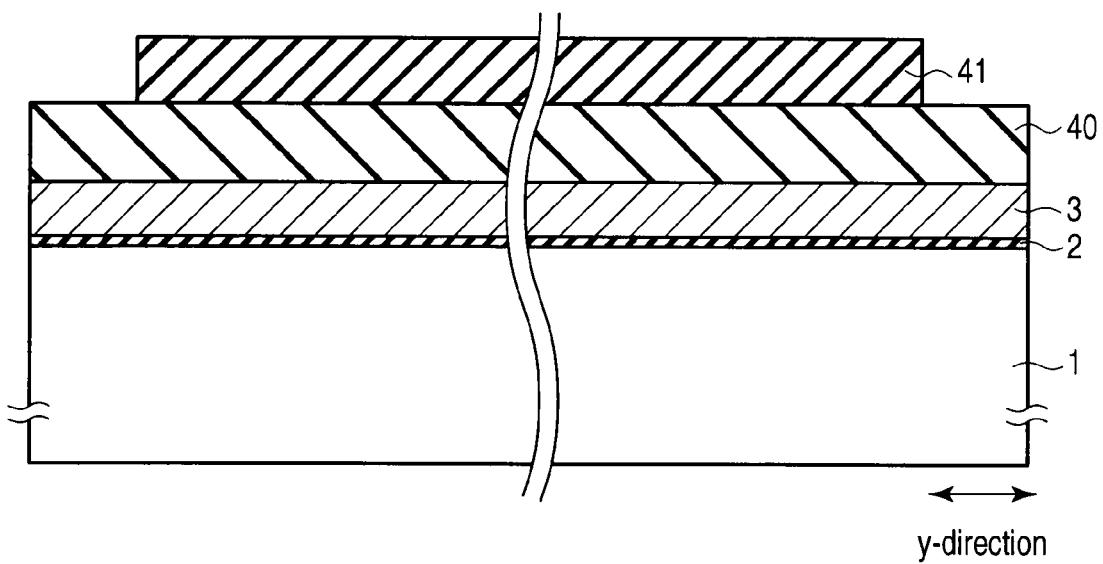
FIG. 14 is a sectional view along line XIV-XIV in FIG. 12.

First, one step of the process of manufacturing the flash memory in the present embodiment is described with FIGS. 12 to 14. FIG. 12 schematically shows the planar structure of the whole memory cell array. FIG. 13 schematically shows the sectional structure along line XIII-XIII in FIG. 12. FIG. 14 schematically shows the sectional structure along line XIV-XIV in FIG. 12.

As shown in FIGS. 12 to 14, an insulating film 2 is formed by, for example, the thermal oxidation method on the surface of a semiconductor substrate 1 in which a well area (not shown) is formed. Then, a polysilicon film 3 is formed on the insulating film 2 by, for example, the chemical vapor deposition (CVD) method. The formed insulating film 2 is used as a tunnel insulating films of a memory cell and a gate insulating film of a select transistor. Moreover, the polysilicon film 3 is used as a floating gate electrode of the memory cell. When the memory cell has a MONOS structure, an insulating film such as a silicon nitride film is formed instead of the polysilicon film 3.

Subsequently, a first mask layer 40 (e.g., a silicon nitride film) is deposited on the polysilicon film 3 by, for example, the CVD method. Then, a linear core material 41 extending in the y-direction (second direction) is formed on the mask layer 40 by, for example, the CVD method, the photolithographic technique or the reactive ion etching (RIE) method. A plurality of core materials 41 are formed on the mask layer 40, and these core materials 41 are provided side-by-side in the x-direction at intervals of a fabrication limit dimension (feature size) F. The material used for this core material 41 is different from, for example, the material used for the mask layer, and can ensure sufficient etching selectivity between the core material and the mask layer.

Then, the core material 41 is slimmed by etching. Due to this slimming, the dimension of the core material 41 in the x-direction is changed from the fabrication limit dimension (feature size) F (dashed lines in FIG. 13) obtained by the photolithography (exposure) to a dimension (line width) W1 smaller than the feature size F.

Figure 15:
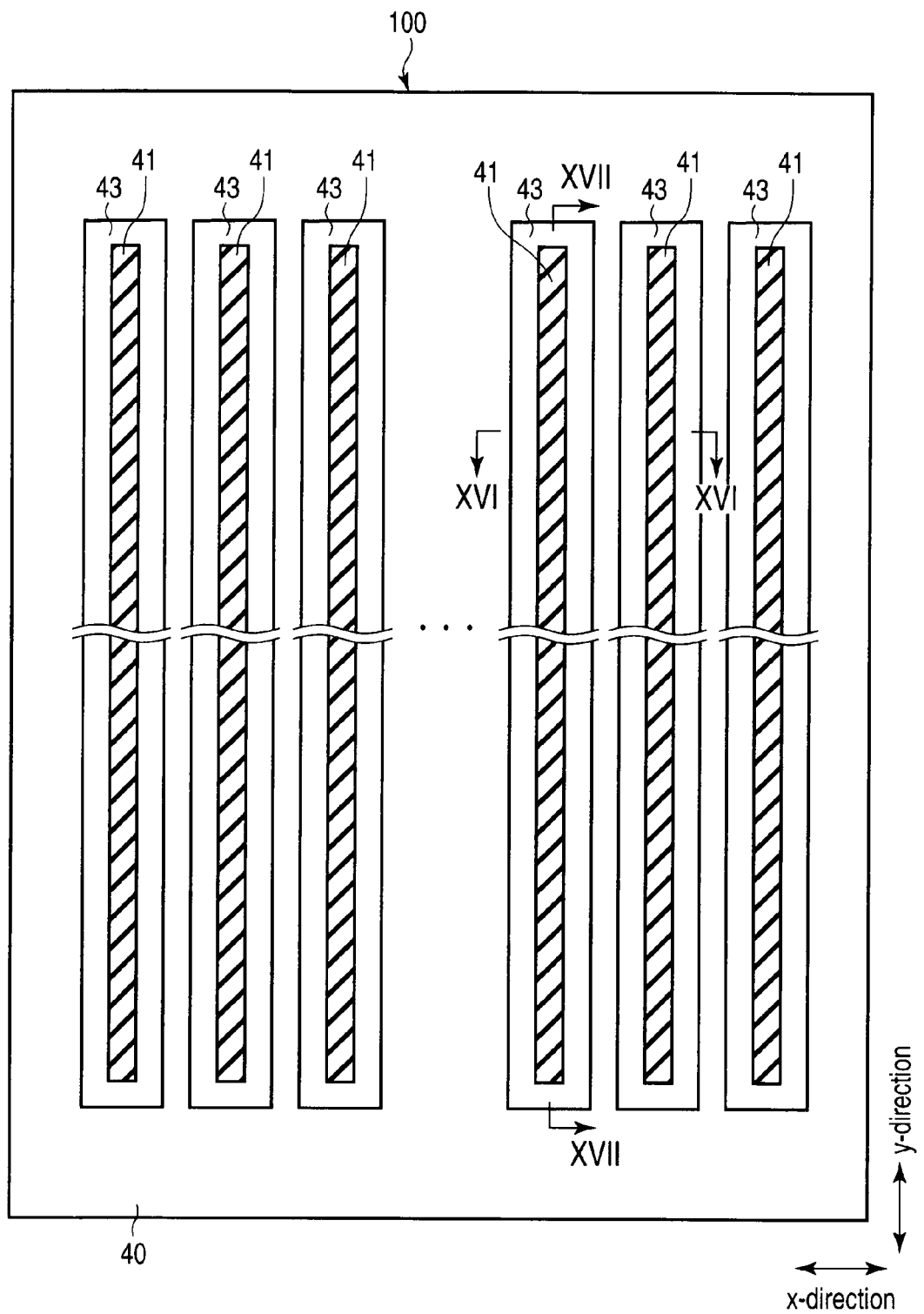
FIG. 15 is a diagram schematically showing the planar structure in one step of the manufacturing process in the first embodiment.
Figure 16:
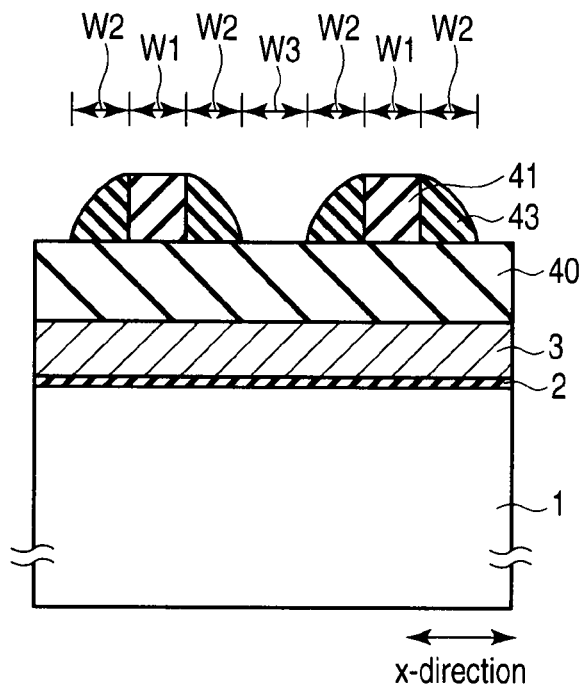
FIG. 16 is a sectional view along line XVI-XVI in FIG. 15.
Figure 17:
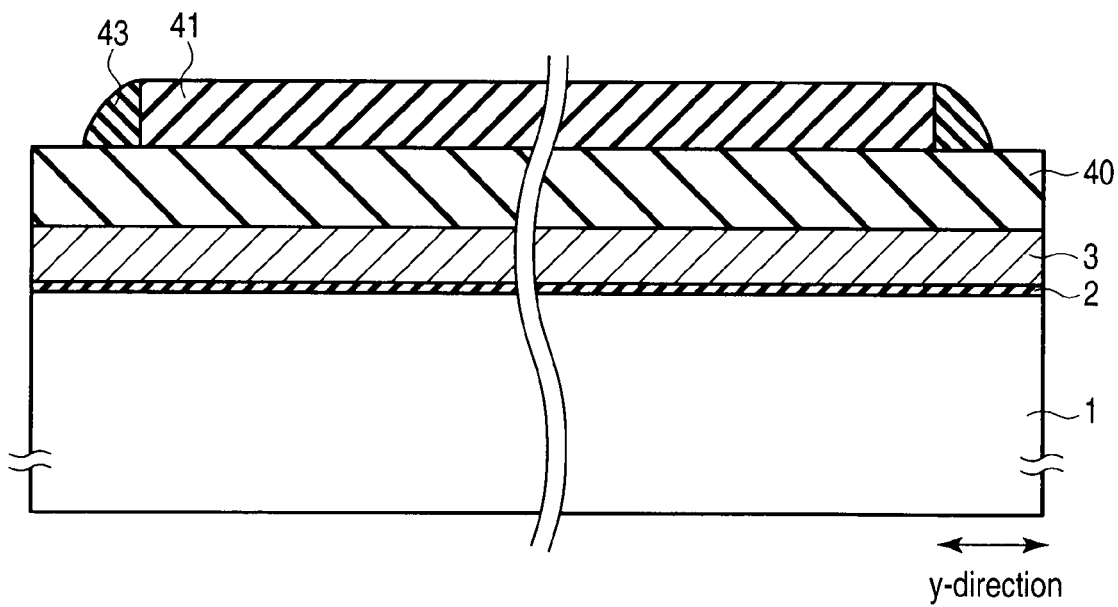
FIG. 17 is a sectional view along line XVII-XVII in FIG. 15.

One step of the process of manufacturing the flash memory in the present embodiment is described with FIGS. 15 to 17. FIG. 15 schematically shows the planar structure of the whole memory cell array. FIG. 16 schematically shows the sectional structure along line XVI-XVI in FIG. 15. FIG. 17 schematically shows the sectional structure along line XVII-XVII in FIG. 15.

As shown in FIGS. 15 to 17, a mask material is formed on the first mask layer 40 and the core material 41. Then, the mask material is preserved on the side surface of the core material alone in a self-aligning manner by, for example, anisotropic etching such as the RIE method. As a result, a loop-shaped sidewall mask 43 extending around the core material 41 is formed. A dimension (line width) W2 of the sidewall mask 43 in the x-direction is smaller than the feature size F. The dimension W2 is a minimum fabrication size.

The material (mask material) used for this sidewall mask 43 is different from the materials used for the first mask layer 40 and the core material 41, and can ensure sufficient etching selectivity with respect to the first mask layer 40 and the core material 41. As one example of a combination of materials, a polysilicon film, for example, is used for the core material 41, and a silicon oxide film, for example, is used for the sidewall mask 43 in the case where a silicon nitride film is used for the first mask layer 40.

Here, when the dimension (distance) of a space where the core material 41 and the sidewall mask 43 are not provided is W3, the relation among the dimensions W1, W2 and W3 is preferably W1=W2=W3. In this case, the relation of these dimensions with the fabrication limit dimension (feature size) F is $W1=W2=W3=(½)\times F$.

One step of the process of manufacturing the flash memory in the present embodiment is described with FIGS. 18 to 21. FIG. 18 schematically shows the planar structure of the whole memory cell array. FIG. 19 schematically shows the sectional structure along line XIX-XIX in FIG. 18. FIG. 20 schematically shows the sectional structure along line XX-XX in FIG. 18. FIG. 21 schematically shows the sectional structure along line XXI-XXI in FIG. 18.

As shown in FIGS. 18 to 21, the core material 41 is selectively removed, the sidewall mask 43 is only preserved. Then, the terminal end (loop portion) of the sidewall mask 43 in the y-direction is removed by etching, so that the linear sidewall mask 43 extending in the y-direction is formed. Removing the loop portions of the loop-shaped sidewall masks and forming the independent linear sidewall masks 43 in this manner is hereinafter referred to as loop cutting.

Thus, the plurality of linear sidewall masks 43 are arranged on the first mask layer 40 in the x-direction. In the step described later, the semiconductor substrate 1 under the sidewall mask 43 will be an active area having the dimension (line width) W2 smaller than the feature size F.

Moreover, for example, dummy active areas DAA having a dimension greater than the dimension of the active area in the x-direction is provided at one end and the other of the memory cell array 100 in the x-direction. Therefore, as shown in FIG. 20, the core materials 41 provided at one end and the other of the memory cell array 100 in the x-direction may be preserved without being removed.

Thus, the core material 41 and the sidewall masks 43 formed on both side surfaces of the core material 41 are used as one mask 45, such that the dummy active area DAA can be formed in the semiconductor substrate 1 under the mask 45.

One step of the process of manufacturing the flash memory in the present embodiment is described with FIGS. 22 to 26. FIG. 22 schematically shows the planar structure of the whole memory cell array. FIG. 23 is a plan view extracting one part XXIII of the memory cell array. FIG. 24 shows the sectional structure along line XXIV-XXIV in FIG. 23. FIG. 25 shows the sectional structure along line XXV-XXV in FIG. 23. FIG. 26 shows the sectional structure along line XXVI-XXVI in FIG. 22.

As shown in FIGS. 22 to 26, in the memory cell array 100, a plurality of linear resist masks 47 extending in the x-direction, for example, are formed on the first mask layer 40 and the sidewall mask 43 across the sidewall mask 43 extending in the y-direction. The resist masks 47 are formed, for example, between two source-line-side select gate line formation areas SGSL in the memory cell array 100 as shown in FIG. 23, more specifically, formed over the upper part of the source line contact area SA. Here, the resist masks are not formed between bit-line-side select gate line formation areas, more specifically, over the upper part of the bit line contact area.

That is, in one block formation area where a plurality of active areas are formed, the linear resist mask 47 extending in the x-direction (first direction) is formed over the upper part of one end (the source line contact area SA) of the block formation area. On the other hand, no resist mask is formed over the upper part of the other end (the bit line contact area) of one block formation area.

The terminal end of the resist mask 47 in the x-direction is located on, for example, the mask 45. The dimension (line width) of the resist mask 47 in the y-direction is, for example, greater than or equal to the feature size F. Otherwise, the resist mask 47 may be slimmed into a dimension (line width) smaller than the feature size F.

In addition, in the memory cell array 100, the structure of the part where the resist mask 47 is not formed is the same as the structure shown in FIGS. 19 to 21.

Figure 29:
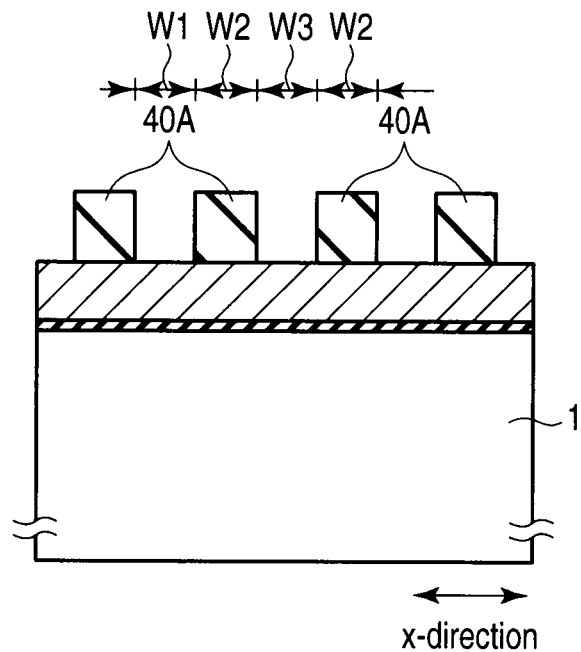
FIG. 29 is a sectional view along line XXIX-XXIX in FIG. 27.
Figure 30:
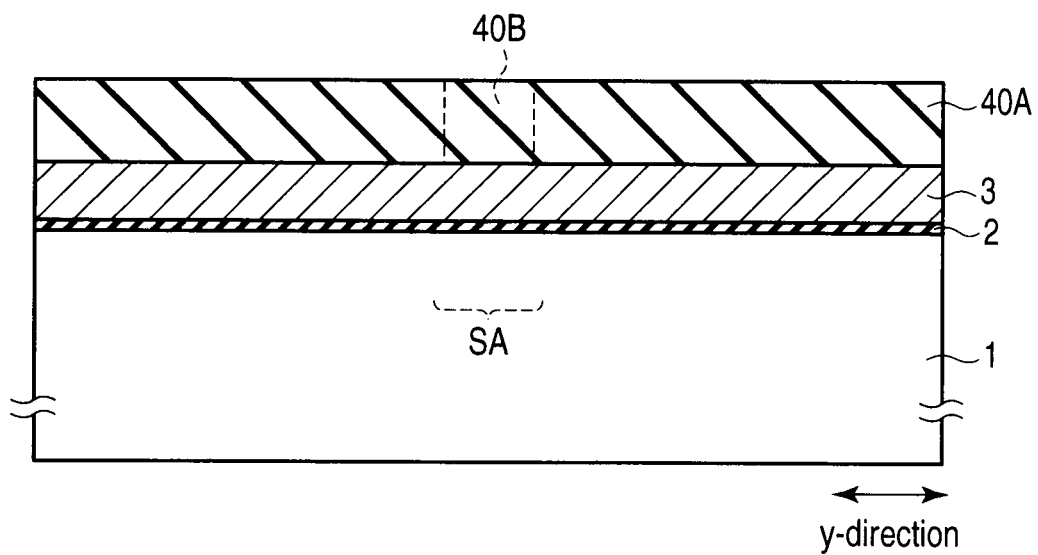
FIG. 30 is a sectional view along line XXX-XXX in FIG. 27.
Figure 31:
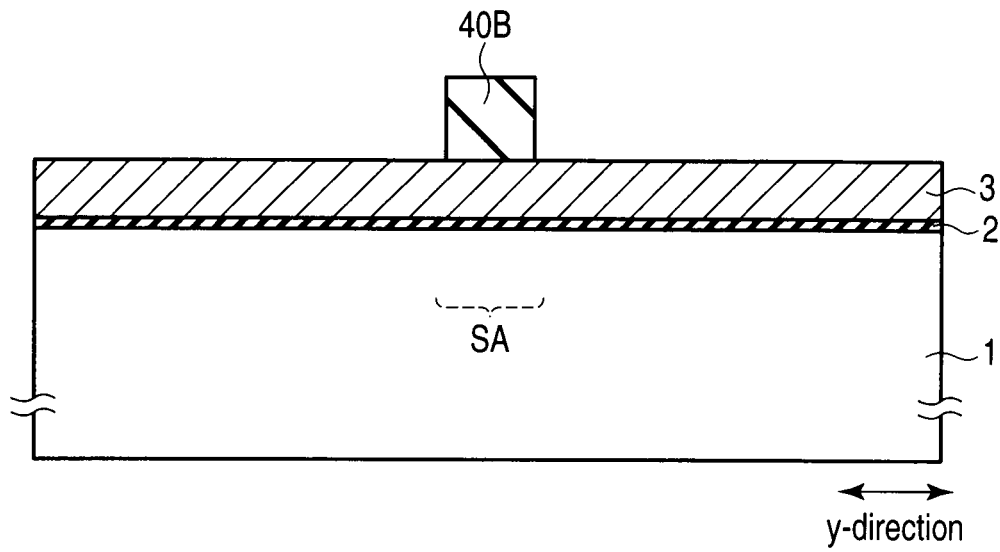
FIG. 31 is a sectional view along line XXXI-XXXI in FIG. 27.
Figure 32:
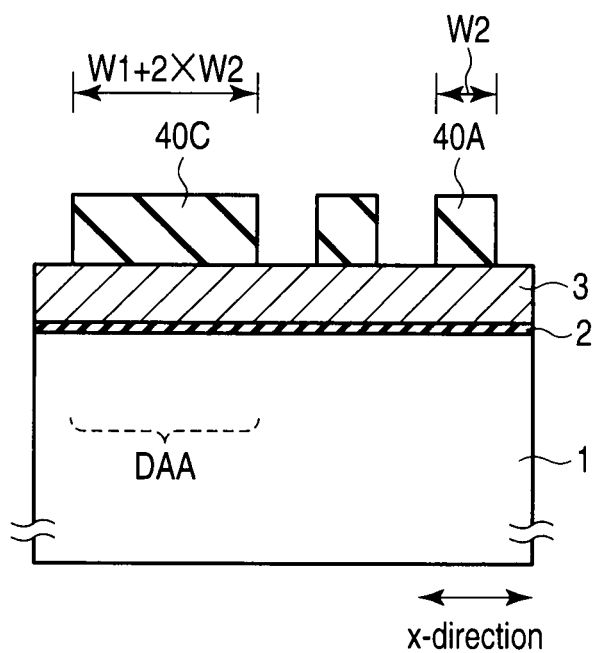
FIG. 32 is a sectional view for explaining one step of the manufacturing method in the first embodiment.

One step of the process of manufacturing the flash memory in the present embodiment is described with FIGS. 27 to 32. FIG. 27 is a diagram schematically showing the planar structure of part of the memory cell array, and shows a region corresponding to FIG. 23. FIG. 28 shows the sectional structure along line XXVIII-XXVIII in FIG. 27. FIG. 29 shows the sectional structure along line XXIX-XXIX in FIG. 27. FIG. 30 shows the sectional structure along line XXX-XXX in FIG. 27. FIG. 31 shows the sectional structure along line XXXI-XXXI in FIG. 27. In addition, FIG. 32 is a sectional process diagram corresponding to FIG. 26.

The first mask layer 40 is etched by, for example, the RIE method on the basis of the sidewall mask 43 and the resist mask 47 shown in FIGS. 22 to 26. After the etching, the sidewall mask 43 and the resist mask 47 are removed. As a result, a mask pattern based on the sidewall mask 43 and the resist mask 47 is transferred onto first mask layers 40A, 40B.

As shown in FIGS. 27 to 32, the part 40A extending in the y-direction in the patterned first mask layers 40A, 40B is a part where the pattern of the sidewall mask has been transferred, and has, for example, about the same dimension as dimension W2 of the sidewall mask.

The part 40B extending in the x-direction in the patterned first mask layers 40A, 40B is a part where the pattern of the resist mask has been transferred. The first mask layer 40B covers the upper part of the source line contact area SA. The dimension of the first mask layer 40B in the y-direction is, for example, greater than or equal to the feature size F.

FIG. 32 shows a section along the x-direction in the vicinity of the dummy active area DAA. In this region, a pattern composed of the core material and the sidewall masks formed on both side surfaces of the core material is transferred onto a first mask layer 40C, and the part under this mask 40C is used as the dummy active area. The dimension of the mask layer 40C in the x-direction is equal to the sum of the dimensions (2×W2) of two sidewall masks and dimension W1 of the core material. That is, when W1=W2, the dimension of the mask layer 40C is equal to about 3×W2.

In addition, the loop cutting performed in the step described with FIGS. 18 to 21 may not be performed for the sidewall mask in this step. After the pattern of the loop-shaped sidewall mask is transferred onto the first mask layer 40, the loop cutting may be performed for the first mask layers 40A, 40B in the present step (FIGS. 27 to 32).

Figure 35:
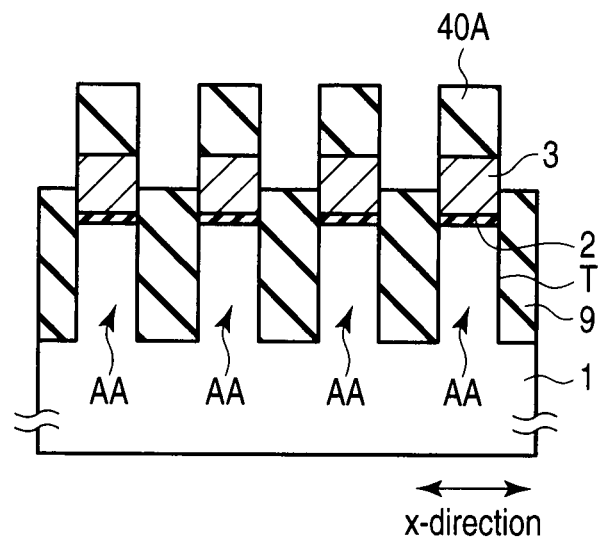
FIG. 35 is a sectional view along line XXXV-XXXV in FIG. 33.
Figure 36:
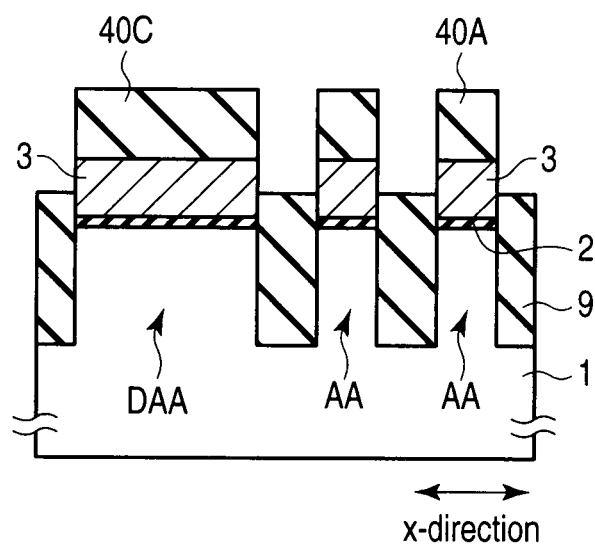
FIG. 36 is a sectional view for explaining one step of the manufacturing method in the first embodiment.

One step of the process of manufacturing the flash memory in the present embodiment is described with FIGS. 33 to 36. FIG. 33 is a diagram schematically showing the planar structure of part of the memory cell array, and is a diagram corresponding to FIG. 23. FIG. 34 shows the sectional structure along line XXXIV-XXXIV in FIG. 33. FIG. 35 shows the sectional structure along line XXXV-XXXV in FIG. 34. FIG. 36 is a sectional process diagram corresponding to FIG. 32.

As shown in FIG. 33 to FIG. 36, the polysilicon film 3 and the semiconductor substrate 1 are etched using the patterned first mask layers 40A, 40B as masks, such that a trench T is formed in the semiconductor substrate 1.

When the polysilicon film 3 and the semiconductor substrate 1 are etched by the sidewall fabrication technique, the shallow trenches T and deep trenches T are often alternately arranged in the semiconductor substrate 1. This is attributed to the asymmetric shape of the upper part of the sidewall mask 43 or to variations in the fabrication of the core materials in the photolithographic step/slimming step described with FIGS. 12 to 14 and associated variations in the shape and dimension of the sidewall masks 43.

Furthermore, an isolation insulating film 9 is embedded in the formed trench T. Then, for example, the upper surface of the isolation insulating film 9 is etched, so that the upper end of the isolation insulating film 9 is set back toward the semiconductor substrate 1 further than the upper end of the polysilicon film 3.

As a result, the active area AA interposed between two element isolation areas STI (isolation insulating films 9) arranged in the x-direction is formed in the semiconductor substrate 1. As has been described in the step shown in FIG. 29, the mask layer 40A having the line width W2 smaller than the feature size F is used as a mask to form the active area AA, so that the active area AA has a dimension smaller than the feature size F.

Here, as the surface of the source line contact area SA is covered with the mask layer 40B during the trench formation step in the present embodiment, no trench is formed in the source line contact area SA.

Therefore, the source line contact area SA at one end of the memory cell unit formation area (active area AA) is not divided by the isolation insulating film 9, and serves as one semiconductor area extending in the x-direction such that the source line contact area SA is connected to one end of all of a plurality of active areas AA adjacent in the x-direction. The bit line contact area as the other end of the active areas AA is divided by the isolation insulating film 9.

At the same time, at the end of the memory cell array in the x-direction, the dummy active area DAA is formed in the semiconductor substrate 1 using the mask layer 40C as a mask, as shown in FIG. 36. Thus, in the present embodiment, the active area AA and the dummy active area DAA having different dimensions (line widths) can be formed at the same time, thereby enabling simplification of the manufacturing process.

Figure 37:
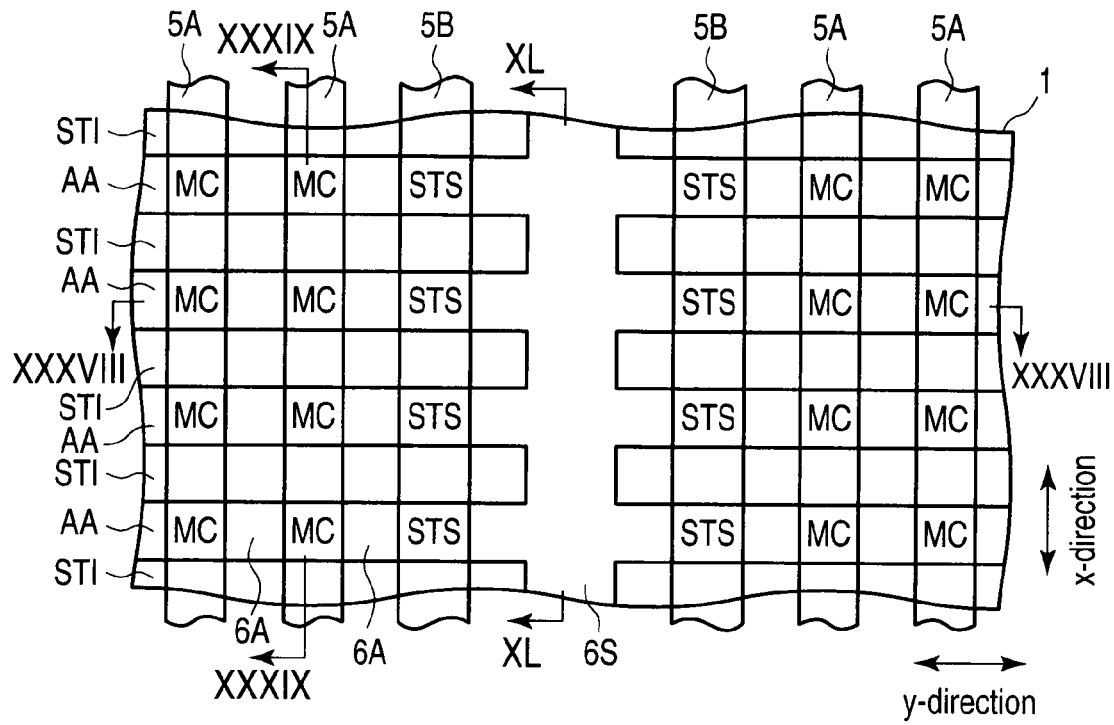
FIG. 37 is a plan view for explaining one step of the manufacturing method in the first embodiment.
Figure 38:
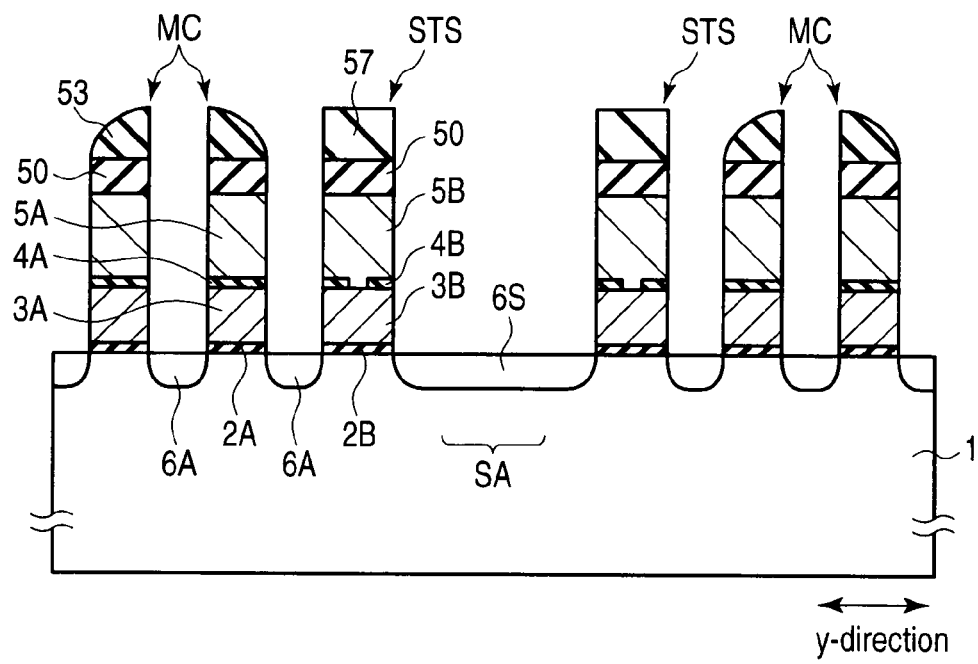
FIG. 38 is a sectional view along line XXXVIII-XXXVIII in FIG. 37.
Figure 39:
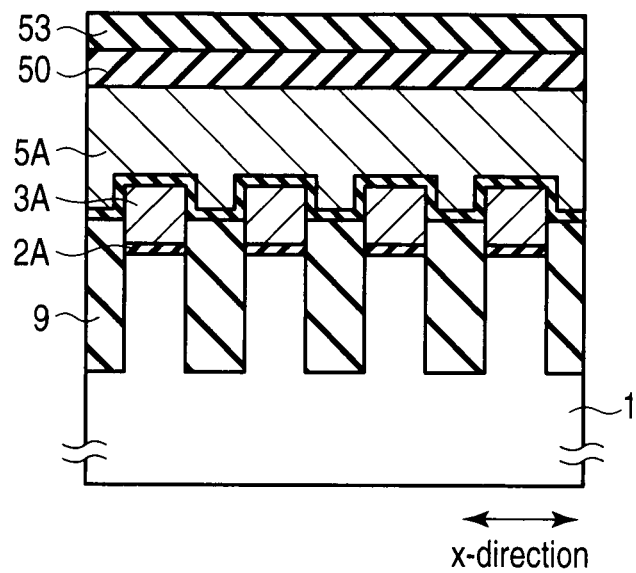
FIG. 39 is a sectional view along line XXXIX-XXXIX in FIG. 37.
Figure 40:
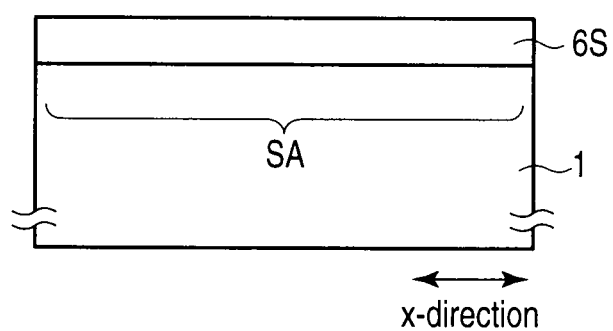
FIG. 40 is a sectional view along line XL-XL in FIG. 37.

One step of the process of manufacturing the flash memory in the present embodiment is described with FIGS. 37 to 40. FIG. 37 is a diagram schematically showing the planar structure of part of the memory cell array, and is a diagram corresponding to FIG. 23. FIG. 38 shows the sectional structure along line XXXVIII-XXXVIII in FIG. 37. FIG. 39 shows the sectional structure along line XLIX-XLIX in FIG. 37. FIG. 40 shows the sectional structure along line XL-XL in FIG. 37.

After the first mask layers 40A, 40B shown in FIGS. 33 to 36 are removed, an intergate insulating film material and a polysilicon film (control gate electrode material) are sequentially formed on the polysilicon film 3 by, for example, the CVD method.

Then, by the step substantially similar to the step shown in FIGS. 12 to 21, a second mask layer 50 is formed on the polysilicon films 5A, 5B, and a core material (not shown) and a sidewall mask 53 are formed on the second mask layer 50. Further, gate fabrication for the memory cell MC is carried out by the sidewall fabrication technique using the sidewall mask 53 as a mask. As a result, a stack gate structure composed of a floating gate electrode 3A and the control gate electrode 5A is formed under the sidewall mask 53.

As the dimension of the gate electrode of the select transistor STS in the y-direction is greater than the dimension of the gate electrode of the memory cell MC in the y-direction, the gate electrodes 3B, 5B may be formed by, for example, the exposure technique using a resist mask 57 as in FIG. 38. However, the present invention is not limited to this, and gate fabrication for the select transistor may be carried out by the sidewall fabrication technique. When the sidewall fabrication technique is used, the core material in the select transistor formation area is preserved on the second mask layer 50 without being removed, and the core material and the sidewalls formed on the side surfaces of the core material are used as one mask to perform the gate fabrication for the select transistor, for example, similarly to the step of forming the dummy active area DAA.

After the gate fabrication, the formed gate electrodes 5A, 5B are used as masks to form source/drain diffusion layers 6A, 6S of the memory cell and the select transistor in the semiconductor substrate 1 (active area AA). As described above, the source line contact area SA extends in the x-direction, so that the source/drain diffusion layer 6S of the source-side select transistor STS is shared by a plurality of source-side select transistors STS adjacent in the x-direction. The source/drain diffusion layer 6S is also shared by two source-side select transistors STS adjacent in the y-direction.

After the masks 50, 53, 57 used for the gate fabrication are removed, a known technique is used to form an interlayer insulating film 10 and silicide a control gate electrode (word line), as shown in FIG. 4 to 11.

A linear trench Z extending in the x-direction is formed in the interlayer insulating film 10 on the source line contact area SA. A plug material such as tungsten (W) or molybdenum (Mo) is embedded in this trench Z, and a linear (LI structure) source line contact LI is formed on the source/drain diffusion layer 6S. In the present embodiment, no isolation insulating film 9 is formed in the source line contact area SA, and the source line contact area SA is one semiconductor area (source/drain diffusion layer 6S).

Therefore, even if the surface of the source line contact area SA is subjected to the etching condition for the interlayer insulating film 10 during the formation of the trench Z in the interlayer insulating film 10, the planarity of the source/drain diffusion layer 6S as the source line contact area SA is retained. As a result, the bottom surface of the source line contact LI formed on the source/drain diffusion layer 6S is planar.

A bit line contact BC is connected to each of the active areas AA (bit line contact areas) divided by the isolation insulating films 9 through a contact hole formed in the interlayer insulating film 10, simultaneously with the source line contact LI during the formation of the source line contact. However, as the bit line contact BC is different in shape from the source line contact LI, the bit line contact BC may be formed in a step separate from the source line contact LI.

Then, a first metal interconnect layer M0 is formed on the interlayer insulating film 10. The metal interconnect layer M0 connected to the source line contact LI functions as a source line SL. Moreover, the metal interconnect layer M0 connected to the bit line contact BC functions as an intermediate layer for a bit line formed in a subsequent step. An interlayer insulating film 11 is formed on the metal interconnect layer M0 and the interlayer insulating film 10.

Subsequently, an interlayer insulating film 12 and a bit line BL are formed. The sidewall fabrication technique is used in the step of forming the bit line BL, for example, as in the step of forming the active area and word line (control gate electrode). However, when the sidewall fabrication technique is used in the step of forming the bit line BL, a sidewall mask is used as a mask to form a trench extending in the y-direction in the interlayer insulating film 12, unlike the step of forming the active area and the step of forming the word line. Then, the damascene technique for embedding a metal material in the formed trench is used to form the bit line BL. Alternatively, the photolithographic technique may be used to form the bit line BL.

Furthermore, a via contact for connecting the bit line BL to the metal interconnect layer M0 may be formed in the interlayer insulating film 11 before the interlayer insulating film 12 is deposited. Alternatively, the damascene technique may be used to embed, simultaneously with the formation of the bit line BL, the via contact in a contact hole separately formed in the interlayer insulating film 11.

As described above, the flash memory which is the nonvolatile semiconductor memory according to the present embodiment is manufactured.

In the method of manufacturing the nonvolatile semiconductor memory (flash memory) according to the first embodiment of the present invention, the linear resist mask 47 extending in the x-direction is formed on the source line contact area SA before the step of forming the active area AA using the sidewall mask 43 by the sidewall fabrication technique. Then, the semiconductor substrate 1 is etched using the pattern based on the sidewall mask 43 and the resist mask 47, and a plurality of active areas having a dimension smaller than the fabrication limit dimension obtained by lithography are formed.

Here, etching using the sidewall mask as a mask is not performed in the part patterned by the resist mask 47 extending in the x-direction, that is, in the source line contact area SA. Therefore, no trench and isolation insulating film 9 are formed in the source line contact area SA, so that the source line contact area SA is one semiconductor area (diffusion layer area) extending in the x-direction shared by the plurality of active areas (memory cell unit formation area) AA arranged in the x-direction.

In the present embodiment, even if the source line contact area SA is subjected to the etching condition for the interlayer insulating film 10 when the trench Z to embed the source line contact of the LI structure is formed in the interlayer insulating film 10 on the source line contact area SA, the planarity of the surface of the source line contact area SA is retained because no isolation insulating film is provided in this area SA. As a result, the bottom surface of the source line contact LI of the LI structure is planar.

Thus, in the present embodiment, in the source line contact area SA, the isolation insulating film is not etched and reduced in thickness during the formation of the contact and the upper surface of the isolation insulating film is thus not set back toward the semiconductor substrate further than the upper end of the active area. Moreover, in the present embodiment, the bottom surface of the source line contact LI of the LI structure does not contact the side surface of the active area AA in the x-direction.

Therefore, in the flash memory manufactured by the manufacturing method described above, there is neither decrease in the breakdown voltage of the isolation insulating film nor generation of a leakage current.

Consequently, according to the method of manufacturing the nonvolatile semiconductor memory (flash memory) in the first embodiment of the present invention, deterioration of element characteristics can be prevented.

(2) Second Embodiment

Figure 41:
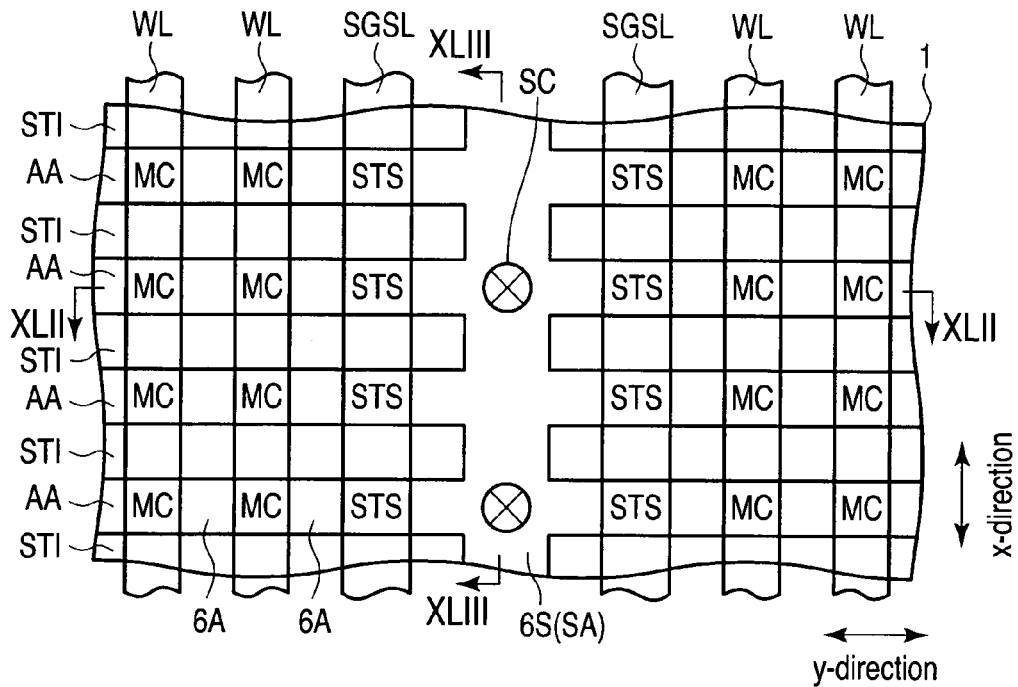
FIG. 41 is a plan view showing the structure of a nonvolatile semiconductor memory according to a second embodiment.
Figure 42:
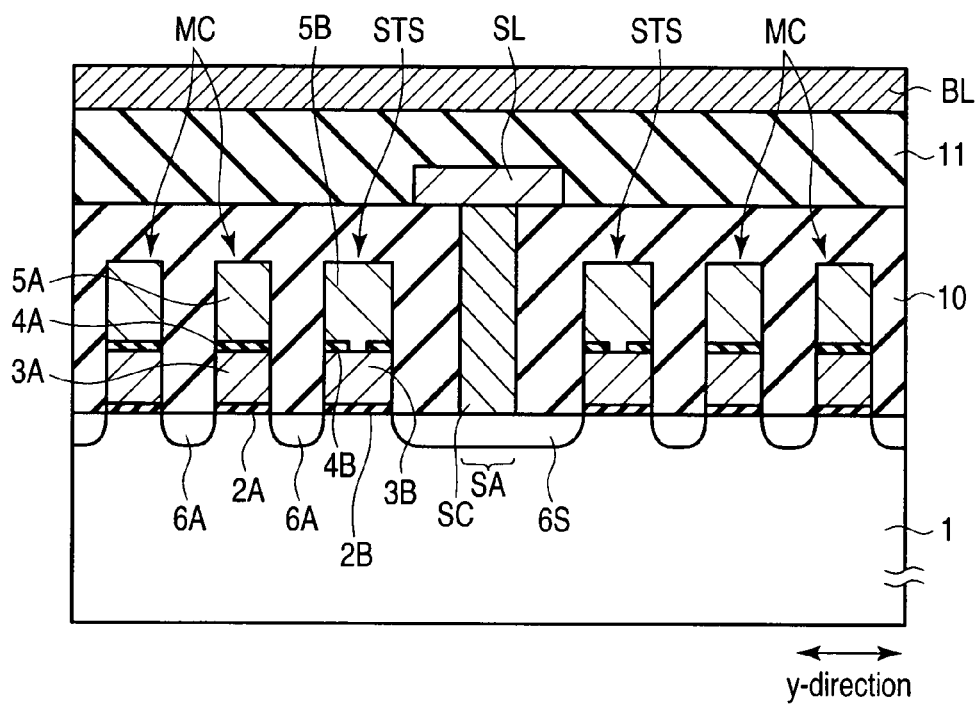
FIG. 42 is a sectional view along line XLII-XLII in FIG. 41.
Figure 43:
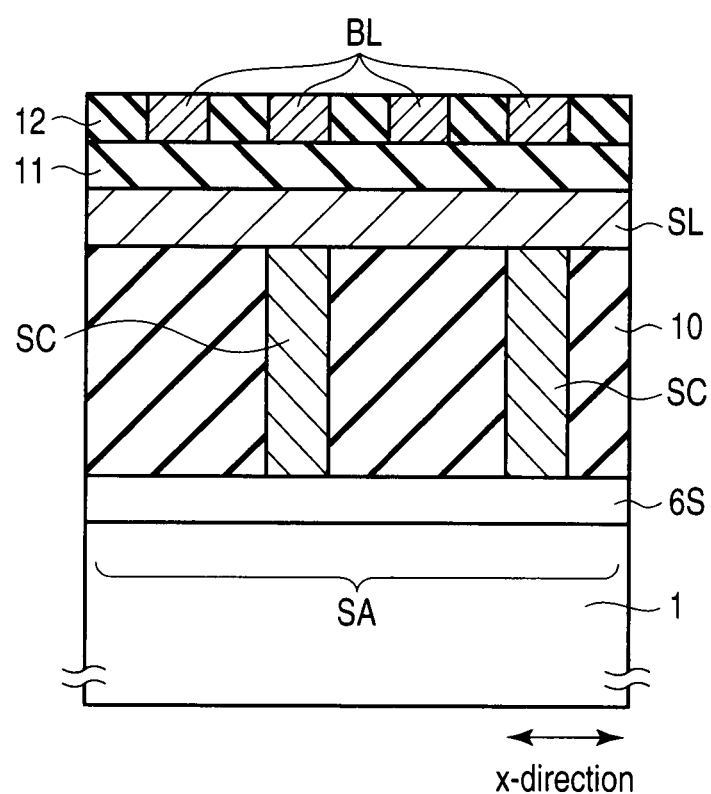
FIG. 43 is a sectional view along line XLIII-XLIII in FIG. 41.

A nonvolatile semiconductor memory according to a second embodiment of the present invention is described with FIGS. 41 to 43. It is to be noted that the same components as the components described in the first embodiment are provided with the same signs and are not described in detail.

The present embodiment is different from the first embodiment in the shape of the source line contact. The linear source line contact LI extending in the x-direction is used in the first embodiment.

Contrarily, in the present embodiment, source line contacts SC are contact plugs independently arranged in the x-direction. The source line contacts SC in the present embodiment are arranged in a source line contact area SA, for example, every other active area (NAND cell unit) arranged in the x-direction.

A method of manufacturing the nonvolatile semiconductor memory (flash memory) according to the present embodiment is substantially the same as the manufacturing method described in the first embodiment. However, in the present embodiment, no linear trench is formed in an interlayer insulating film 10 on the source line contact area SA, but contact holes are formed in the interlayer insulating film 10 at predetermined parts in the source line contact area SA. Then, source line contacts SC are embedded in the contact holes.

The source line contacts SC are formed, for example, simultaneously with bit line contacts BC.

In the present embodiment, similarly to the first embodiment, the source line contact area SA where the source line contact SC is provided is one semiconductor area (source/drain diffusion layer 6S) extending in the x-direction, and is connected by active areas (second active areas) arranged in the x-direction.

In the present embodiment, the plurality of independent source line contacts SC are provided in the source line contact area SA.

When the linear source line contact LI is used as in the first embodiment, the areas of the bottoms of the bit line contact BC and the linear source line contact LI are different due to the difference of shape between these contacts. As a result, the etching rate of the interlayer insulating film 10 is different between the bit line contact side and the linear source line contact side, so that it is difficult to have the same end point of the etching of a semiconductor substrate 1 for the bit line contact BC and the linear source line contact LI.

On the contrary, if the shape of the source line contact SC is the same as the shape of the bit line contact BC as in the present embodiment, the bit line contact BC and the source line contact SC can be fabricated in the same step and with the same end point.

Furthermore, when the independent contact plugs are connected to the active areas which are used by the sidewall fabrication technique and which are divided by isolation insulating films, misalignment of the contact plugs with active areas (contact areas) reduces the area of contact therebetween and increases parasitic resistance in the contact part.

However, according to the present embodiment, the source line contact area SA is one semiconductor area connected by the plurality of active areas (second active areas) arranged in the x-direction, so that there is no misalignment of the source line contact SC with the source line contact area SA. Therefore, there is no deterioration of element characteristics due to the parasitic resistance either.

Consequently, according to the second embodiment of the present invention, deterioration of the characteristics of the nonvolatile semiconductor memory (flash memory) can be prevented. Moreover, according to the nonvolatile semiconductor memory in the second embodiment of the present invention, the steps of manufacturing the nonvolatile semiconductor memory can be reduced.

(3) Third Embodiment

A third embodiment of the present invention is described with FIGS. 44 to 46. It is to be noted that the same components as the components in the first and second embodiments are provided with the same signs and are not described in detail.

(a) Structure

The structure of a nonvolatile semiconductor memory (flash memory) according to the third embodiment of the present invention is described with FIG. 44 and FIG. 45. FIG. 44 shows the overall configuration of a memory cell array, and FIG. 45 shows the sectional structure along line XLV-XLV in FIG. 44. The structures of memory cells MC and select transistors STS, STD and the shape of source line contacts LI, SC in the present embodiment are similar to those in the first and second embodiments, and are not described here.

In the case of the loop-cut mask pattern as in the flash memories described in the first and second embodiments, the terminal end of the active area in the y-direction is tapered or chipped such that dust is generated. Accordingly, one problem is the failure of the flash memory due to the dust. Another problem is the decrease of manufacturing yield due to the failure attributed to the dust.

In order to prevent these problems, the flash memory in the present embodiment is provided with, at the terminal ends of active areas AA in the y-direction, extensions 70A, 70B extending in the x-direction. The extension 70A, 70B has, for example, a structure in which a conducting layer 3Z formed on a semiconductor substrate 1 is interposed between two insulating films 2Z, 4Z. The conducting layer 3Z is made of the same material as a floating gate electrode 3A. The insulating film 2Z on the semiconductor substrate 1 is made of the same material as a gate insulating film 2A, and the insulating film 4Z on the conducting layer 3Z is made of the same material as an intergate insulating film 4A.

Thus, as the extensions 70A, 70B are provided, the terminal ends of the active areas in the y-direction are not independent patterns, so that the terminal ends of the active areas can be prevented from being tapered or chipped. Therefore, the failure due to the dust generated from the terminal ends of the active areas AA can be prevented, and the decrease of manufacturing yield due to the failure attributed to the dust can be inhibited.

Moreover, in the embodiment of the present invention, the step of forming the extensions 70A, 70B and the step of forming the source line contact area extending in the x-direction can be carried out at the same time by a manufacturing method described later.

In addition, the plurality of active areas AA adjacent in the x-direction are electrically connected together through the extensions 70A, 70B. However, a dummy line DCG is turned off or brought into a floating state during the operation of the flash memory such that the extensions 70A, 70B are electrically isolated from blocks BLOCK1, BLOCKn provided with memory cells and the like. Thus, there is no problem in circuit operation.

Consequently, according to the nonvolatile semiconductor memory in the third embodiment of the present invention, deterioration of element characteristics can be prevented, and the decrease of manufacturing yield can be prevented. Moreover, according to the nonvolatile semiconductor memory in the present embodiment, the manufacturing process can be simplified.

(b) Manufacturing Method

A method of manufacturing the nonvolatile semiconductor memory (flash memory) in the third embodiment of the present invention is described below. It is to be noted that steps similar to the steps described in the first embodiment are not described in detail.

A sidewall mask 43 is formed on a first mask layer 40 by a step similar to the step shown in FIGS. 12 to 26. Then, a first resist mask 47A is formed on the first mask layer 40 and the plurality of sidewall masks 43 to cover the upper part of a source line contact area SA.

At the same time, in the present embodiment, as shown in FIG. 46, a linear second resist mask 47B extending in the x-direction is formed in addition to a resist mask 47 (indicated as the resist mask 47A in FIG. 46) shown in FIG. 22 to cover the terminal ends of the plurality of sidewall masks 43 in the y-direction. Here, the sections along the x-direction of the terminal ends of the plurality of sidewall masks 43 in the y-direction are similar to the sectional view shown in FIG. 24.

The resist mask 47B is linearly patterned to extend in the x-direction. The linear resist mask 47B extending in the x-direction is formed on the first mask layer 40 and the sidewall masks 43 across the terminal ends of the plurality of sidewall masks 43 extending in the y-direction.

The terminal end of the resist mask 47B in the x-direction is located on, for example, a mask 45. Further, the side surface of the resist mask 47B in the y-direction on one side (the outer side of the memory cell array) is substantially coincident with the terminal end of the mask 45 in the y-direction or is located outside further than the terminal end of the mask layer 45. The resist mask 47B is thus formed so that the terminal ends of the active areas in the y-direction can be effectively prevented from being chipped. In addition, the dimension (line width) of the resist mask 47B in the y-direction is, for example, greater than or equal to the feature size F. Otherwise, the resist mask 47B may be slimmed into a dimension (line width) smaller than the feature size F.

Subsequently, the first mask layer 40 is patterned and the active areas are formed by a step similar to the step shown in FIGS. 27 to 36.

In addition to the patterns of the sidewall mask 43 and the first resist mask 47A, the pattern of the second resist mask 47B is transferred onto the first mask layer 40, so that the first mask layer extending in the x-direction remains at the terminal end of a memory cell array 100 in the y-direction.

On the basis of this pattern of the first mask, a conducting layer 3Z as an extension extending in the x-direction is formed at the terminal ends of the plurality of active areas provided in the memory cell array 100 in the y-direction, simultaneously with the formation of the active areas AA and the source line contact area SA.

Subsequently, by a step similar to the step described with FIGS. 37 to 40, intergate insulating films 4A, 4B are formed, and an insulating film 4Z made of the same material as the intergate insulating film 4A is formed on the conducting layer 3Z. As a result, an extension 70A, 70B composed of two insulating films 2Z, 4Z and the conducting layer 3Z is formed. Then, gate electrodes 3A, 5A of a memory cell MC are formed by gate fabrication after a control gate electrode material is deposited. Further, a source/drain diffusion layer 6A is formed. However, the conducting material (control gate electrode material) on the extension 3Z is removed in the region where the extension 70A, 70B is provided.

Then, contacts LI, SC, BC, a source line SL and a bit line BL are formed by a step similar to the step shown in FIGS. 4 to 11.

The flash memory according to the present embodiment is manufactured by the process described above.

In the present embodiment, the extensions 70A, 70B shared by the plurality of active areas AA arranged in the x-direction are provided at the terminal ends of the active areas in the y-direction. Thus, the terminal ends of the active areas in the y-direction are not independent patterns, so that the terminal ends of the active areas can be prevented from being tapered or chipped, and the generation of dust can be prevented.

Furthermore, in the present embodiment, the step of forming the extensions can be carried out simultaneously with the step of patterning and processing the source line contact area, and it is therefore possible to prevent the increase of manufacturing steps.

Consequently, according to the method of manufacturing the nonvolatile semiconductor memory (flash memory) in the third embodiment of the present invention, it is possible to provide a nonvolatile semiconductor memory in which deterioration of element characteristics can be prevented, and the manufacturing process can be simplified.

3. Others

According to the embodiments of the present invention, deterioration of element characteristics can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a memory cell array provided in a semiconductor substrate;
three or more first active areas which are provided in the memory cell array side-by-side in a first direction, each of the first active areas extending in a second direction intersecting with the first direction;
a plurality of second active areas provided between the first active areas adjacent in the first direction, respectively and along the first direction;
a memory cell unit which is provided in each of the three or more first active areas and which includes memory cells and select transistors, current paths of the memory cells and current paths of the select transistors being connected in series along the second direction;
a linear contact which is connected to a source of the memory cell unit and which extends in the first direction and has a linear planer shape;
a source line connected to the linear contact and extending in the first direction; and
a dummy active area provided at the end of the memory cell array in the first direction,
wherein an area in which the linear contact is provided is one semiconductor region to which the three or more first active areas are connected by the plurality of second active areas, and
the bottom surface of the linear contact is planar and contacts all of the first and second active areas in the one semiconductor region,
the end of the linear contact in the first direction is located on the dummy active area in the first direction, and
a width of the dummy active area in the first direction is larger than that of the first active area in the first direction.

2. The nonvolatile semiconductor memory according to claim 1, wherein
the terminal ends of the plurality of first active areas in the second direction are provided with an extension connected to the plurality of first active areas.

3. The nonvolatile semiconductor memory according to claim 1, wherein
a width in the second direction of an area where the linear contact is provided is greater than or equal to the fabrication limit dimension obtained by lithography.

4. The nonvolatile semiconductor memory according to claim 1, further comprising:
a columnar contact connected to the other end of each of the plurality of first active areas.

5. The nonvolatile semiconductor memory according to claim 4, wherein
a plurality of areas where the columnar contact is provided are electrically isolated from each other in the first direction by an insulating film provided in the semiconductor substrate for each of the first active areas.

6. The nonvolatile semiconductor memory according to claim 1, wherein
the dummy active area is provided at an end portion of a block included in the memory cell array.

* * * * *